US012648208B2

(12) United States Patent
Lee et al.

(10) Patent No.: US 12,648,208 B2
(45) Date of Patent: Jun. 2, 2026

(54) SEMICONDUCTOR DEVICES

(71) Applicant: Samsung Electronics Co., Ltd.,
Suwon-si (KR)

(72) Inventors: Wonhyuk Lee, Incheon (KR); Sangduk Park, Hwaseong-si (KR); Dongsoo Seo, Seoul (KR); Hongsik Shin, Seoul (KR); Jinwook Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 693 days.

(21) Appl. No.: 18/079,057

(22) Filed: Dec. 12, 2022

(65) Prior Publication Data

US 2023/0335606 A1     Oct. 19, 2023

(30) Foreign Application Priority Data

Apr. 19, 2022    (KR) ........................ 10-2022-0048350

(51) Int. Cl.
*H10D 64/23*       (2025.01)
*H10D 30/01*       (2025.01)
        (Continued)

(52) U.S. Cl.
CPC ......... *H10D 64/258* (2025.01); *H10D 30/014* (2025.01); *H10D 30/024* (2025.01);
        (Continued)

(58) Field of Classification Search
CPC .. H10D 30/6757; H10D 30/797; H10D 30/62; H10D 64/015; H10D 64/017;
        (Continued)

(56) References Cited

U.S. PATENT DOCUMENTS 6,469,467 B1    10/2002  Fujita
6,787,292 B2     9/2004  Choi
        (Continued)

FOREIGN PATENT DOCUMENTS

KR     1019940004996 B1     6/1994
KR          100392407 B1     7/2003
        (Continued)

*Primary Examiner* — Christine S. Kim
*Assistant Examiner* — Nathalie R Fayette
(74) *Attorney, Agent, or Firm* — Muir Patent Law, PLLC

(57)        ABSTRACT

A semiconductor device includes a gate structure on a substrate, a gate spacer on a sidewall of the gate structure, a source/drain layer on a portion of the substrate adjacent to the gate structure, and a first contact plug on the source/drain layer and contacting an outer sidewall of the gate spacer. The gate structure includes a first conductive pattern having a lower portion and an upper portion on the lower portion with a width greater than the lower portion and in contact with an inner sidewall of the gate spacer, a second conductive pattern on a lower surface and a sidewall of the lower portion of the first conductive pattern, and a gate insulating pattern on a lower surface and an outer sidewall of the second conductive pattern. An upper surface of the first conductive pattern is substantially coplanar with an upper surface of the first contact plug.

19 Claims, 42 Drawing Sheets

(51) Int. Cl.

| | |
|---|---|
| *H10D 30/43* | (2025.01) |
| *H10D 30/62* | (2025.01) |
| *H10D 30/67* | (2025.01) |
| *H10D 62/10* | (2025.01) |
| *H10D 64/01* | (2025.01) |

(52) U.S. Cl.
CPC ......... *H10D 30/43* (2025.01); *H10D 30/6211* (2025.01); *H10D 30/6219* (2025.01); *H10D 30/6729* (2025.01); *H10D 30/6735* (2025.01); *H10D 62/121* (2025.01); *H10D 64/01* (2025.01)

(58) Field of Classification Search
CPC .. H10D 64/518; H10D 62/364; H10D 62/822; H10D 64/251; H10D 64/667; H10D 62/151; H10D 84/834; H10D 64/666; B82Y 10/00

See application file for complete search history.

(56) References Cited

U.S. PATENT DOCUMENTS

| | | | |
|---|---|---|---|
| 8,741,753 B2* | 6/2014 | Choi | ................... H10D 30/601 |
| | | | 438/584 |
| 9,496,361 B1 | 11/2016 | Tung et al. | |
| 9,824,920 B2 | 11/2017 | Park et al. | |
| 10,763,327 B2 | 9/2020 | Yeung et al. | |
| 11,227,917 B1 | 1/2022 | Chung et al. | |
| 2003/0059724 A1 | 3/2003 | Choi | |
| 2013/0323923 A1 | 12/2013 | Koehler et al. | |
| 2017/0110542 A1* | 4/2017 | Lee | ...................... H10D 84/038 |
| 2019/0378722 A1* | 12/2019 | Economikos | .......... H10D 30/62 |
| 2020/0266271 A1 | 8/2020 | Lin et al. | |
| 2021/0098588 A1 | 4/2021 | Chung et al. | |
| 2021/0134944 A1* | 5/2021 | Su | ..................... H10D 84/0158 |
| 2021/0351299 A1* | 11/2021 | Huang | .............. H01L 21/76802 |

FOREIGN PATENT DOCUMENTS

| | | | |
|---|---|---|---|
| KR | 100475107 | B1 | 3/2005 |
| KR | 100185209 | B1 | 12/2018 |

* cited by examiner

F I G. 13
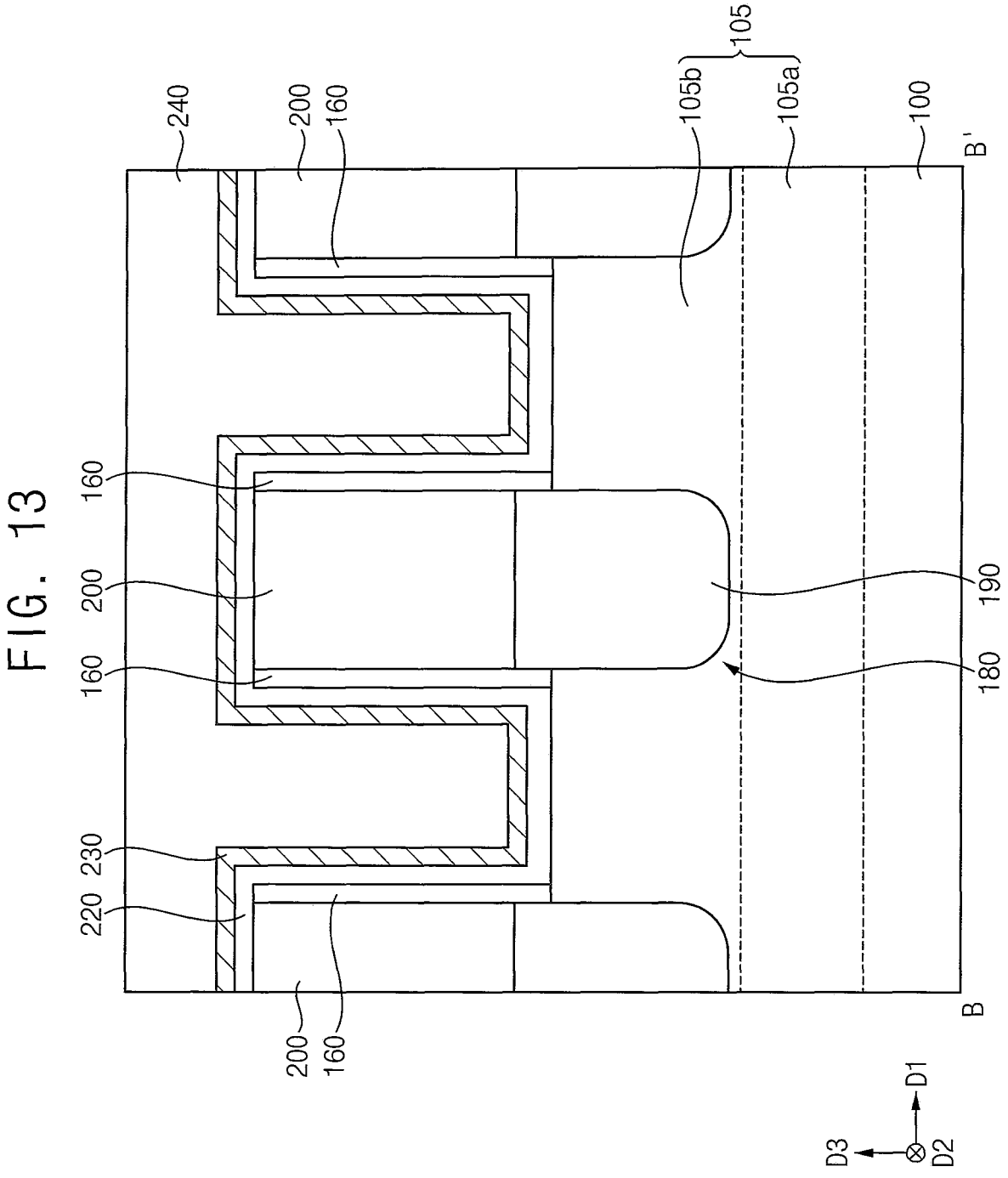

FIG. 27
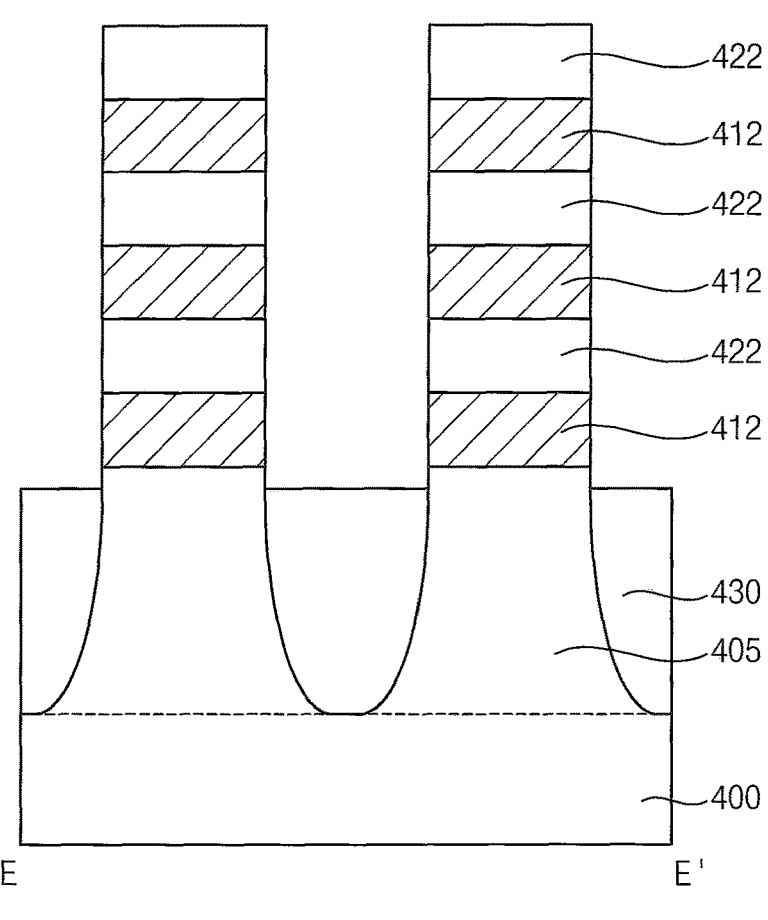
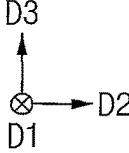

SEMICONDUCTOR DEVICES

CROSS-REFERENCE TO RELATED APPLICATION

This application claims priority under 35 USC § 119 to Korean Patent Application No. 10-2022-0048350, filed on Apr. 19, 2022 in the Korean Intellectual Property Office (KIPO), the contents of which are herein incorporated by reference in their entirety.

TECHNICAL FIELD

Example embodiments relate to a semiconductor device. More particularly, example embodiments relate to a semiconductor device including a contact plug.

DISCUSSION OF RELATED ART

In a logic device, contact plugs and vias may be formed in order to connect a gate structure and source/drain layers to upper wirings that may apply electrical signals thereto. However, as the integration degree of the logic device increases and the sizes of components included therein decrease, an electrical short may occur between the gate structure and the contact plug or between the gate structure and the via.

SUMMARY

Example embodiments provide a semiconductor device having improved characteristics.

According to example embodiments, there is provided a semiconductor device. The semiconductor device may include a gate structure on a substrate, a gate spacer on a sidewall of the gate structure, a source/drain layer on a portion of the substrate adjacent to the gate structure, and a first contact plug on the source/drain layer and contacting an outer sidewall of the gate spacer. The gate structure includes a first conductive pattern having a lower portion and an upper portion on the lower portion with a width greater than a width of the lower portion and in contact with an inner sidewall of the gate spacer, a second conductive pattern on a lower surface and a sidewall of the lower portion of the first conductive pattern, and a gate insulating pattern on a lower surface and an outer sidewall of the second conductive pattern. An upper surface of the first conductive pattern is substantially coplanar with an upper surface of the first contact plug.

According to example embodiments, there is provided a semiconductor device. The semiconductor device may include a plurality of channels spaced apart from each other on a substrate in a vertical direction substantially perpendicular to an upper surface of the substrate, a gate structure on the substrate and covering upper and lower surfaces and a sidewall of a portion of each channel of the plurality of channels, a gate spacer on a sidewall of a first portion of the gate structure, the first portion of the gate structure being disposed on an uppermost channel of the plurality of channels, a source/drain layer on a portion of the substrate adjacent to the gate structure and contacting sidewalls of the plurality of channels, and a first contact plug on the source/drain layer and contacting an outer wall of the gate spacer. The first portion of the gate structure includes a first conductive pattern having a lower portion on the uppermost channel of the plurality of channels and an upper portion on the lower portion with a width greater than a width of the lower portion and contacting an inner sidewall of the gate spacer, a second conductive pattern on a lower surface and a sidewall of the lower portion of the first conductive pattern, and a gate insulating pattern on a lower surface and an outer sidewall of the second conductive pattern and contacting an upper surface of the uppermost channel of the plurality of channels and the inner sidewall of the gate spacer. An upper surface of the first conductive pattern is substantially coplanar with an upper surface of the first contact plug.

According to example embodiments, there is provided a semiconductor device. The semiconductor device may include an active pattern on a substrate, a gate structure on the active pattern, the gate structure containing a first conductive pattern having a lower portion and an upper portion on the lower portion with a width greater than that of the lower portion, a second conductive pattern on a lower surface and a sidewall of the lower portion of the first conductive pattern, and a gate insulating pattern on a lower surface and an outer sidewall of the second conductive pattern, a gate spacer on a sidewall of the gate structure, a source/drain layer on a portion of the active pattern adjacent to the gate structure, a first contact plug on the source/drain layer and contacting an outer sidewall of the gate spacer, a second contact plug contacting an upper surface of the first conductive pattern, and a via contacting an upper surface of the first contact plug. The upper portion of the gate structure contacts an inner sidewall of the gate spacer, and the upper surface of the first conductive pattern is substantially coplanar with an upper surface of the first contact plug.

In the semiconductor device in accordance with example embodiments, a width in a horizontal direction of the gate spacer between the gate structure and the contact plug may be constant in a vertical direction, and accordingly, an electrical short between the gate structure and the contact plug, or between one of the gate structure and the contact plug and an additional contact plug or a via may be reduced.

However, the effects of the inventive concepts are not limited to the above-mentioned effects, and may be variously expanded without departing from the spirit and scope of the present invention.

BRIEF DESCRIPTION OF THE DRAWINGS

FIGS. 5 to 21 are plan views and cross-sectional views illustrating a method of manufacturing a semiconductor device in accordance with example embodiments.

FIGS. 26 to 42 are plan views and cross-sectional views illustrating a method of manufacturing a semiconductor device in accordance with example embodiments.

DETAILED DESCRIPTION

Example embodiments will be described in detail with reference to the accompanying drawings. Hereinafter, in the specification (and not necessarily in the claims), two directions substantially parallel to an upper surface of a substrate and intersecting each other may be defined as first and second directions D1 and D2, respectively, and a direction substantially perpendicular to the upper surface of the substrate may be defined as a third direction D3. In example embodiments, the first and second directions D1 and D2 may be substantially perpendicular to each other. Terms such as "same," "equal," "planar," "vertical," "parallel," or "coplanar," as used herein encompass near identicality including variations that may occur, for example, due to manufacturing processes. The term "substantially" may be used herein to emphasize this meaning, unless the context or other statements indicate otherwise.

Figure 1:
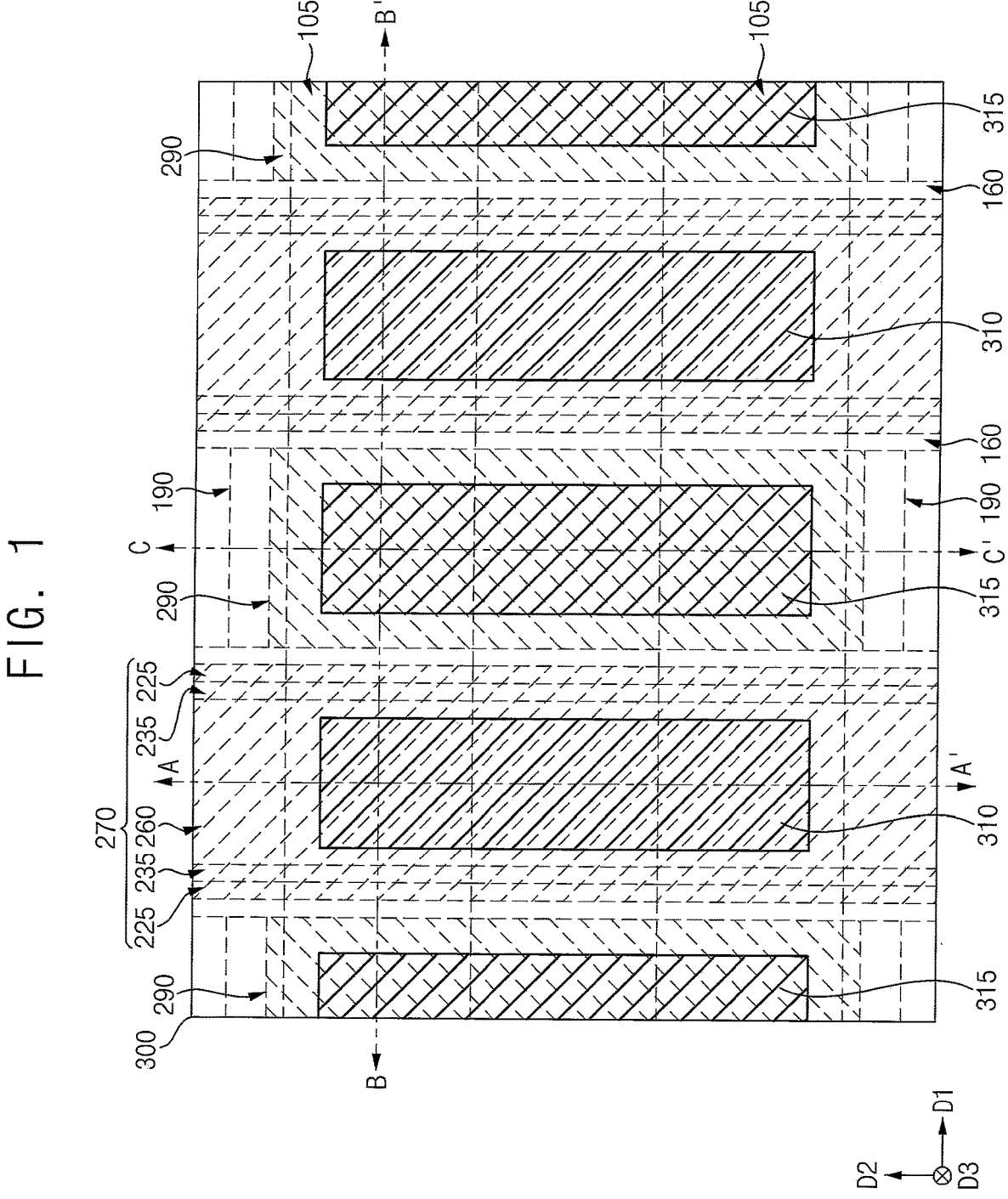
FIGS. 1 to 4 are plan views and cross-sectional views illustrating a semiconductor device in accordance with example embodiments.
Figure 2:
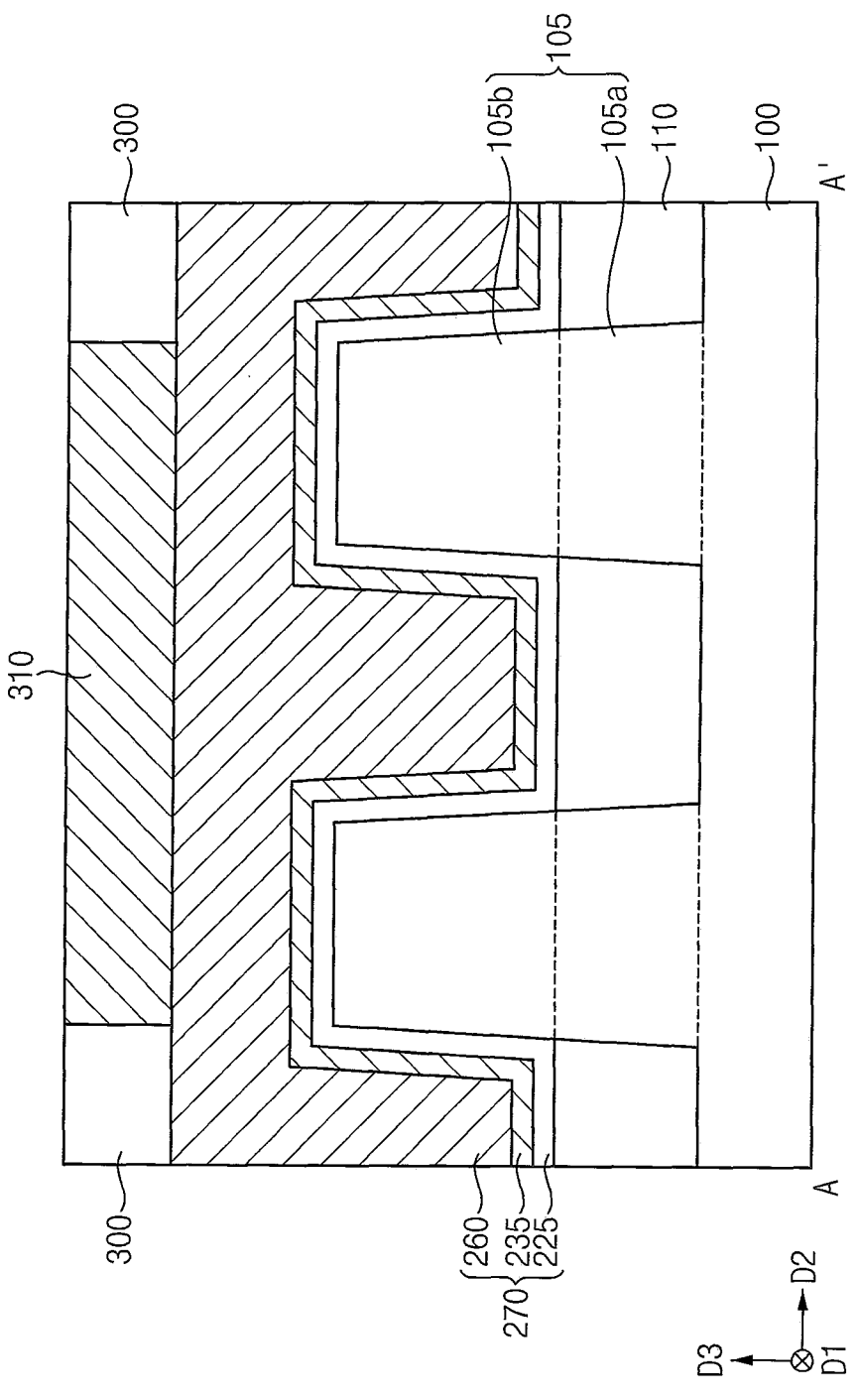
Figure 3:
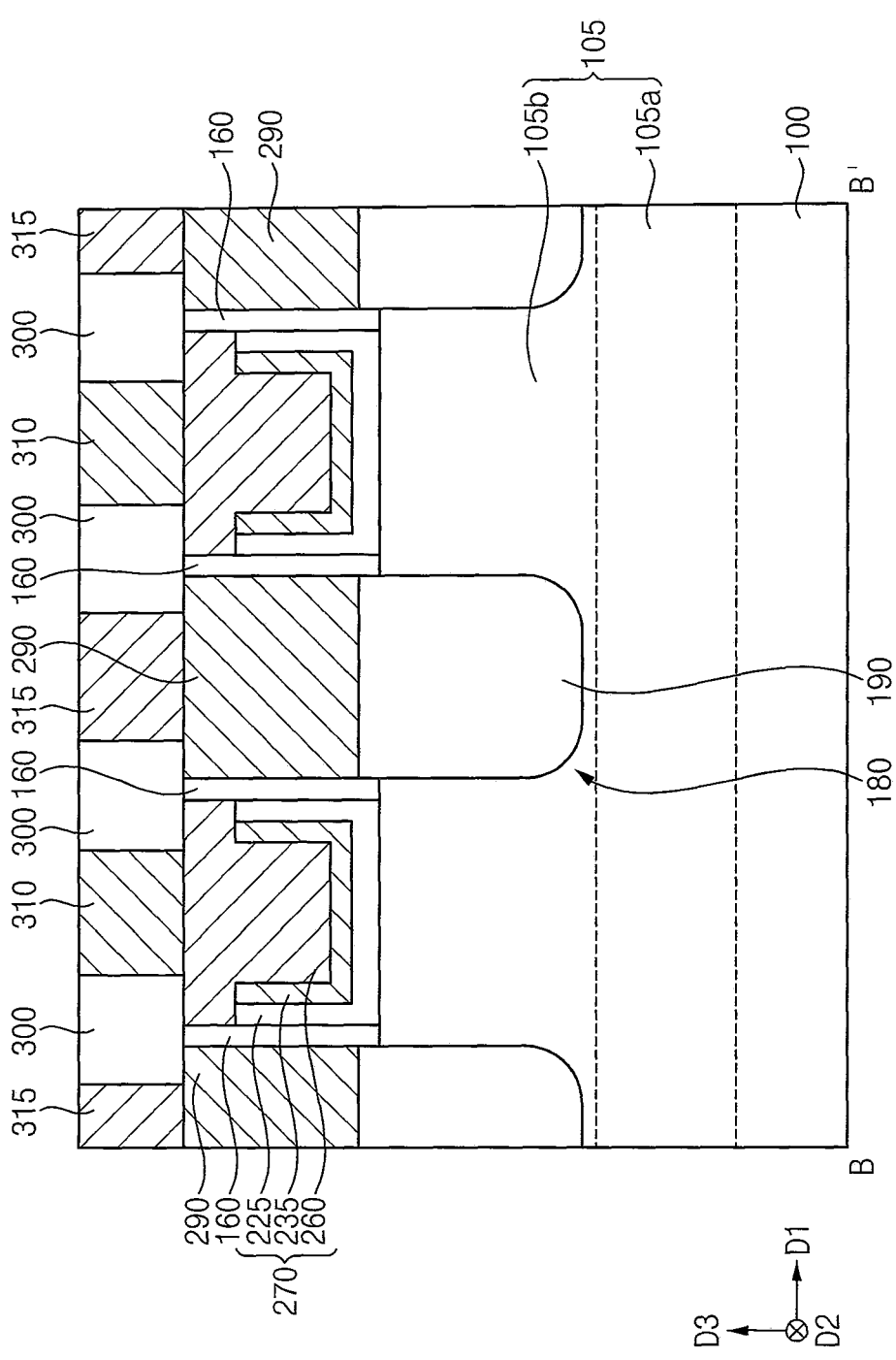
Figure 4:
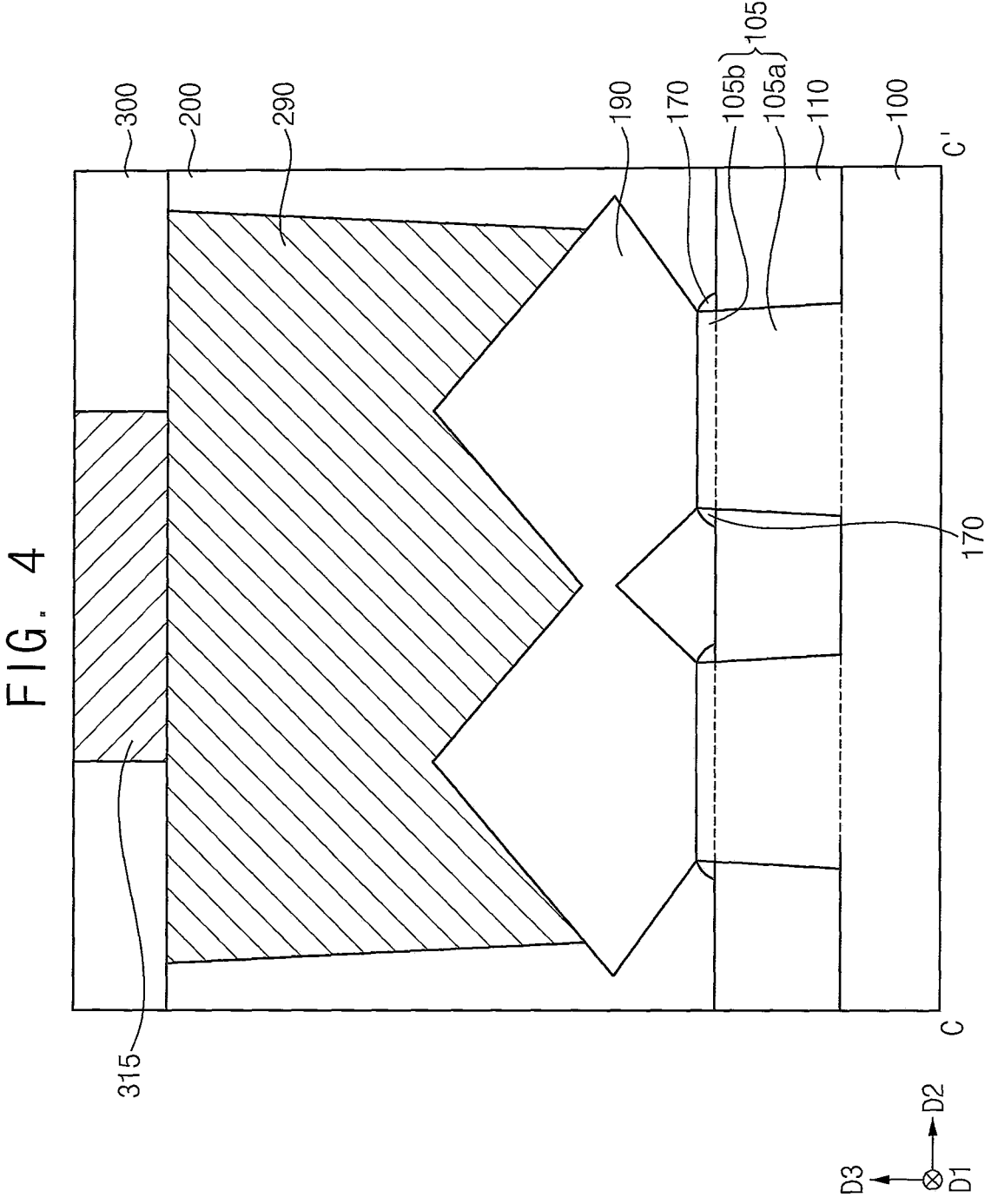

FIGS. 1 to 4 are a plan view and cross-sectional views illustrating a semiconductor device in accordance with example embodiments. Specifically, FIG. 1 is a plan view of a semiconductor device, and FIGS. 2 to 4 are cross-sectional views of the semiconductor device. FIG. 2 is a cross-sectional view taken along line A-A' of FIG. 1, FIG. 2 is a cross-sectional view taken along line B-B' of FIG. 1, and FIG. 4 is a cross-sectional view taken along line C-C' of FIG. 1.

Referring to FIGS. 1 to 4, the semiconductor device may include a first active pattern 105 on a substrate 100, a first isolation pattern 110, a first gate structure 270, a first source/drain layer 190, a first gate spacer 160, a fin spacer 170, first and second contact plugs 290 and 310, a first via 315, and first and second insulating interlayers 200 and 300.

The substrate 100 may include or may be formed of a semiconductor material, e.g., silicon, germanium, silicon-germanium, etc., or a III-V group compound, e.g., GaP, GaAs, GaSb, etc. In example embodiments, the substrate 100 may be a silicon-on-insulator (SOI) substrate or a germanium-on-insulator (GOI) substrate.

The first active pattern 105 may have a fin shape protruding above the substrate 100, and thus may also be referred to as a first active fin. A lower sidewall of the first active pattern 105 may be covered by the first isolation pattern 110. The substrate 100 may include a field region on which first isolation pattern 110 is formed, and an active region on which the first active pattern 105 is formed.

The first active pattern 105 may include a first lower active pattern 105a whose a sidewall is covered by the first isolation pattern 110, and a first upper active pattern 105b whose a sidewall is not covered by the first isolation pattern 110. In example embodiments, the first active pattern 105 may extend in the first direction D1, and a plurality of first active patterns may be spaced apart from each other in the second direction D2.

The first active pattern 105 may include or may be formed of substantially the same material as the substrate 100, and the first isolation pattern 110 may include or may be formed of, for example, oxide such as silicon oxide.

In example embodiments, the first gate structure 270 may extend in the second direction D2 on the first active pattern 105 and the first isolation pattern 110, and a plurality of first gate structures 270 may be spaced apart from each other in the first direction D1. FIGS. 1 to 4 illustrate two of the first gate structures 270 spaced apart from each other in the first direction D1, however, the inventive concept is not limited thereto.

In example embodiments, the first gate structure 270 may include a first gate insulating pattern 225 and a first conductive pattern 235 sequentially stacked on the first active pattern 105 and the first isolation pattern 110, and a second conductive pattern 260 on the first gate insulating pattern 225 and the first conductive pattern 235. The first and second conductive patterns 235 and 260 may form a first gate electrode.

In example embodiments, the second conductive pattern 260 may extend in the second direction D2, and may include a lower portion having a relatively small width in the first direction D1 and an upper portion on the lower portion and having a relatively large width in the first direction D1. In an embodiment, the lower portion of the second conductive pattern 260 may have a first width in the first direction D1, and the upper portion of the second conductive pattern 260 may have a second width, greater than the first width, in the first direction D1. In an embodiment, the second conductive pattern 260 may have a T-shaped cross-section as shown in FIG. 3.

In example embodiments, the first conductive pattern 235 may cover a lower surface and a sidewall of the lower portion of the second conductive pattern 260, and the first gate insulating pattern 225 may cover a lower surface and an outer sidewall of the first conductive pattern 235.

In example embodiments, uppermost surfaces of the first conductive pattern 235 and the first gate insulating pattern 225 may be substantially coplanar with each other, and may contact a lower surface of the upper portion of the second conductive pattern 260. The term "contact," as used herein, refers to a direct connection (i.e., touching) unless the context indicates otherwise.

The first gate structure 270 may further include an interface pattern, which may include or may be formed of, for example, oxide such as silicon oxide, between the first active pattern 105 and/or the first isolation pattern 110 and the first gate insulating pattern 225.

The first gate insulating pattern 225 may include or may be formed of, for example, a metal oxide having a high dielectric constant, such as hafnium oxide ($HfO_2$), tantalum oxide ($Ta_2O_5$), and zirconium oxide ($ZrO_2$).

In example embodiments, each of the first and second conductive patterns 235 and 260 may include or may be formed of, for example, a metal nitride such as titanium nitride (TiN), titanium aluminum nitride (TiAlN), tantalum nitride (TaN), and tantalum aluminum nitride (TaAlN), a metal alloy such as titanium aluminum (TiAl), titanium aluminum carbide (TiAlC), titanium aluminum oxynitride (TiAlON), titanium aluminum carbonitride (TiAlCN), and titanium aluminum oxycarbonitride (TiAlOCN), a metal carbide, a metal oxynitride, a metal carbonitride, a metal oxycarbonitride, or a low resistance metal such as tungsten (W), aluminum (Al), copper (Cu), and tantalum (Ta).

The first and second conductive patterns 235 and 260 may include or may be formed of substantially the same material or different materials.

The first gate spacer 160 may be formed on each of opposite sidewalls of the first gate structure 270 in the first direction D1, and accordingly, an outer sidewall of the first gate insulating pattern 225 and a sidewall of the second conductive pattern 260 may contact an inner sidewall of the first gate spacer 160. In example embodiments, an upper surface of the first gate spacer 160 may be substantially coplanar with an upper surface of the second conductive pattern 260.

The fin spacer 170 may be formed on each of opposite sidewalls in the second direction D2 of the first active pattern 105.

Each of the first gate spacer 160 and the fin spacer 170 may include or may be formed of, for example, an insulating nitride such as silicon nitride (SiN), silicon oxynitride (SiON), silicon oxycarbonitride (SiOCN), or the like.

The first source/drain layer 190 may be formed in a first recess 180 on the first active pattern 105 at each of opposite sides in the first direction D1 of the first gate structure 270, and the first source/drain layer 190 may partially contact a lower sidewall of the first gate spacer 160. In example embodiments, the first source/drain layer 190 may have a shape similar to a pentagon in a cross-section taken along a line extending in the second direction D2.

In example embodiments, if a distance between the first active patterns 105 adjacent to each other in the second direction D2 is small, a plurality of first source/drain layers on upper surfaces of the first active patterns 105, respectively, may be partially merged with each other. FIG. 4 shows two of the first source/drain layers 190 adjacent to each other in the second direction D2 are merged with each other, however, the inventive concept is not limited thereto.

In an example embodiment, the first source/drain layer 190 may include or may be formed of single crystal silicon-germanium doped with p-type impurities, and thus may serve as a source/drain region of a p-type metal-oxide-semiconductor (PMOS) transistor. In an example embodiment, the first source/drain layer 190 may include or may be formed of single crystal silicon carbide doped with n-type impurities or single crystal silicon doped with n-type impurities, and thus may serve as a source/drain region of an N-type metal-oxide-semiconductor (NMOS) transistor.

The first source/drain layer 190 may be covered by the first insulating interlayer 200. The first insulating interlayer 200 may include or may be formed of, for example, silicon oxycarbide (SiOC), silicon oxide (SiO$_2$), silicon nitride (SiN), silicon oxynitride (SiON), silicon carbonitride (SiCN), silicon oxycarbonitride (SiOCN), or the like.

The first contact plug 290 may extend through the first insulating interlayer 200, and may contact an upper surface of the first source/drain layer 190.

In example embodiments, the first contact plug 290 may extend through the first insulating interlayer 200 to contact an outer sidewall of the first gate spacer 160, and thus the first contact plug 290 may be self-aligned to the first gate spacer 160.

In an example embodiment, the first contact plug 290 may include a third conductive pattern on the first source/drain layer 190 and a first barrier pattern covering a lower surface and a sidewall of the third conductive pattern. The third conductive pattern may include or may be formed of, for example, metal such as molybdenum, cobalt, tungsten, or the like, and the first barrier pattern may include or may be formed of, for example, a metal nitride such as titanium nitride, tantalum nitride, tungsten nitride, or the like.

In example embodiments, an upper surface of the first contact plug 290 may be substantially coplanar with the upper surfaces of the first gate spacer 160 and the second conductive pattern 260 adjacent to the first contact plug 290.

The second insulating interlayer 300 may be formed on the first insulating interlayer 200, the first gate structure 270, the first gate spacer 160, and the first contact plug 290. The second insulating interlayer 300 may include or may be formed of, for example, silicon oxycarbide (SiOC), silicon oxide (SiO$_2$), silicon nitride (SiN), silicon oxynitride (SiON), silicon carbonitride (SiCN), silicon oxycarbonitride (SiOCN), or the like.

Each of the second contact plug 310 and the first via 315 may extend through the second insulating interlayer 300. The second contact plug 310 may contact the upper surface of the second conductive pattern 260 included in the first gate structure 270, and the first via 315 may contact the upper surface of the first contact plug 290.

In example embodiments, a lower surface of the second contact plug 310 may be substantially coplanar with a lower surface of the first via 315.

Each of the second contact plug 310 and the first via 315 may include or may be formed of, for example, a metal nitride, a metal silicide, or the like.

First and second wirings contacting upper surfaces of the second contact plug 310 and the first via 315, respectively, and applying an electrical signal thereto may be formed in various layouts.

The semiconductor device may be a fin-type field effect transistor (finFET) including the first gate structure 270 on the first active pattern 105, and the first source/drain layers 190 on respective portions of the first active patterns 105 adjacent to the first gate structure 270.

In the semiconductor device, a width in the first direction D1 of the first gate spacer 160 between the first gate structure 270 and the first contact plug 290 may be constant in the third direction D3. If the first gate spacer 160 has a partially thin width, the first gate structure 270 and the first contact plug 290 including conductive materials may be electrically shorted. However, in example embodiments, the electrical short between the first gate structure 270 and the first contact plug 290 may be reduced or prevented due to the constant width of the first gate spacer 160.

An electrical short between the second contact plug 310 and the first contact plug 290 or an electrical short between the first via 315 and the first gate structure 270, which may occur if the second contact plug 310 or the first via 315 has a large width, may be prevented or reduced. In an embodiment, the first gate spacer 160 may have a thickness sufficient to separate the second contact plug 310 from first contact plug 290 to prevent or reduce electrical short therebetween, and to separate the via 315 from the first gate structure 270. The first gate spacer 160 may vertically extend in the third direction D3 with a constant thickness. If the first gate spacer 160 has a sloped sidewall or a reduced thickness at an upper portion, a distance between the first contact plug 290 and the second contact plug 310 or a distance between the via 315 and the first gate structure 270 may be reduced compared to if the first gate spacer 160 has a constant thickness as shown in FIG. 3, and an electrical short between the first contact plug 290 and the second contact plug 310 or between the via 315 and the first gate structure 270 may occur.

Figure 8:
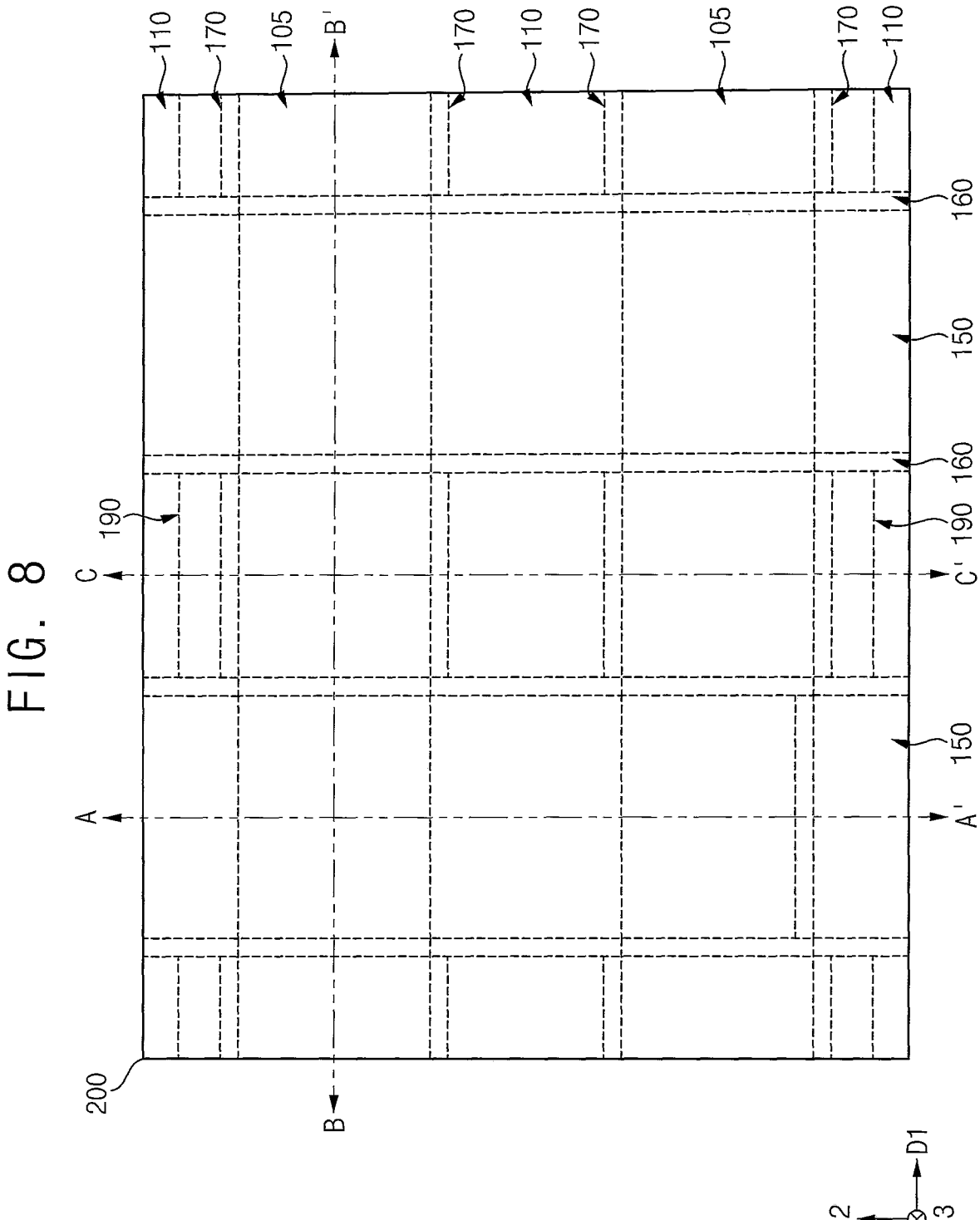
Figure 19:
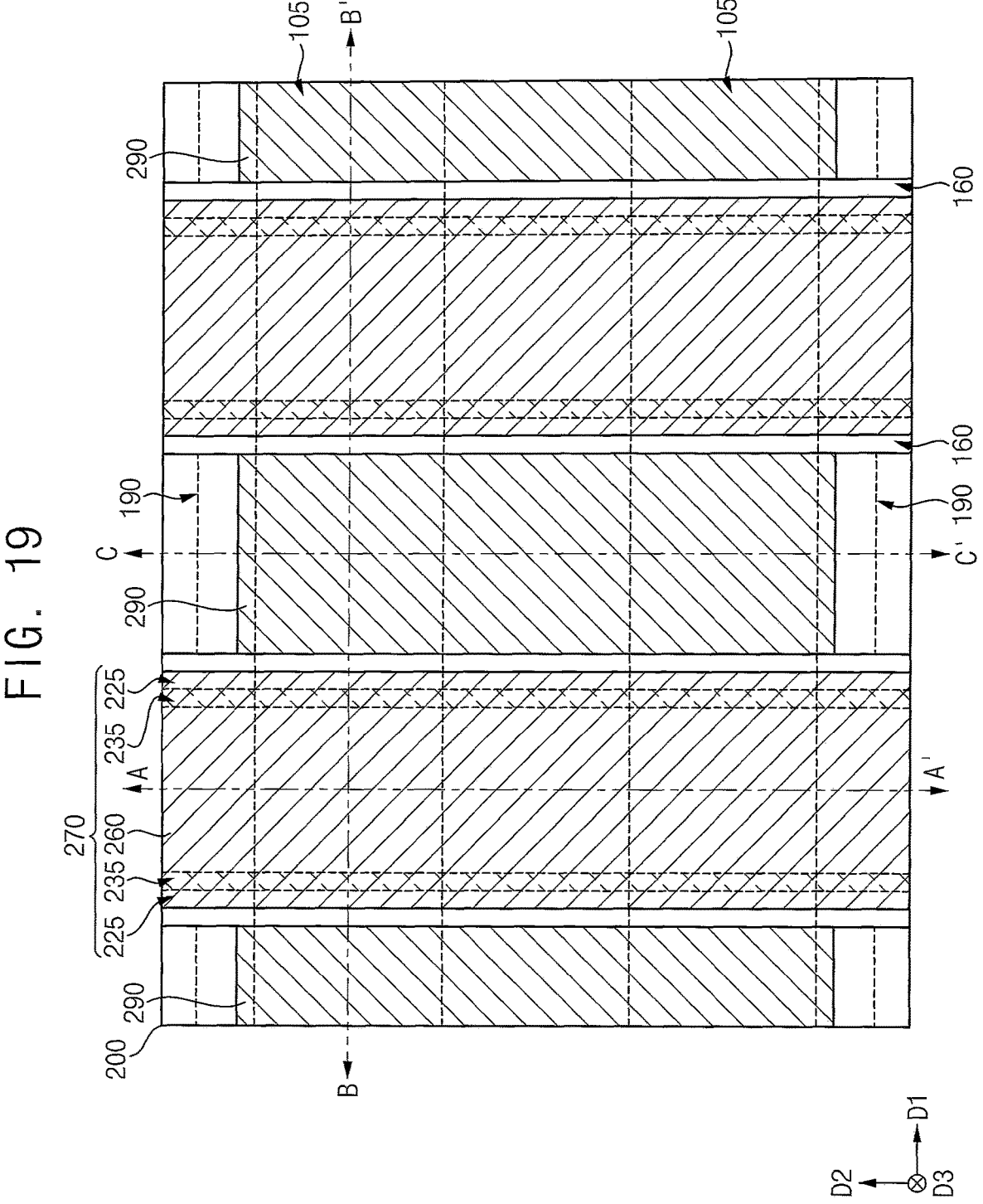

FIGS. 5 to 21 are plan views and cross-sectional views illustrating a method of manufacturing a semiconductor device in accordance with example embodiments. Specifically, FIGS. 5, 8 and 19 are plan views of a semiconductor device, and FIGS. 6-7, 9-18 and 20-21 are cross-sectional views of the semiconductor device.

Figure 10:
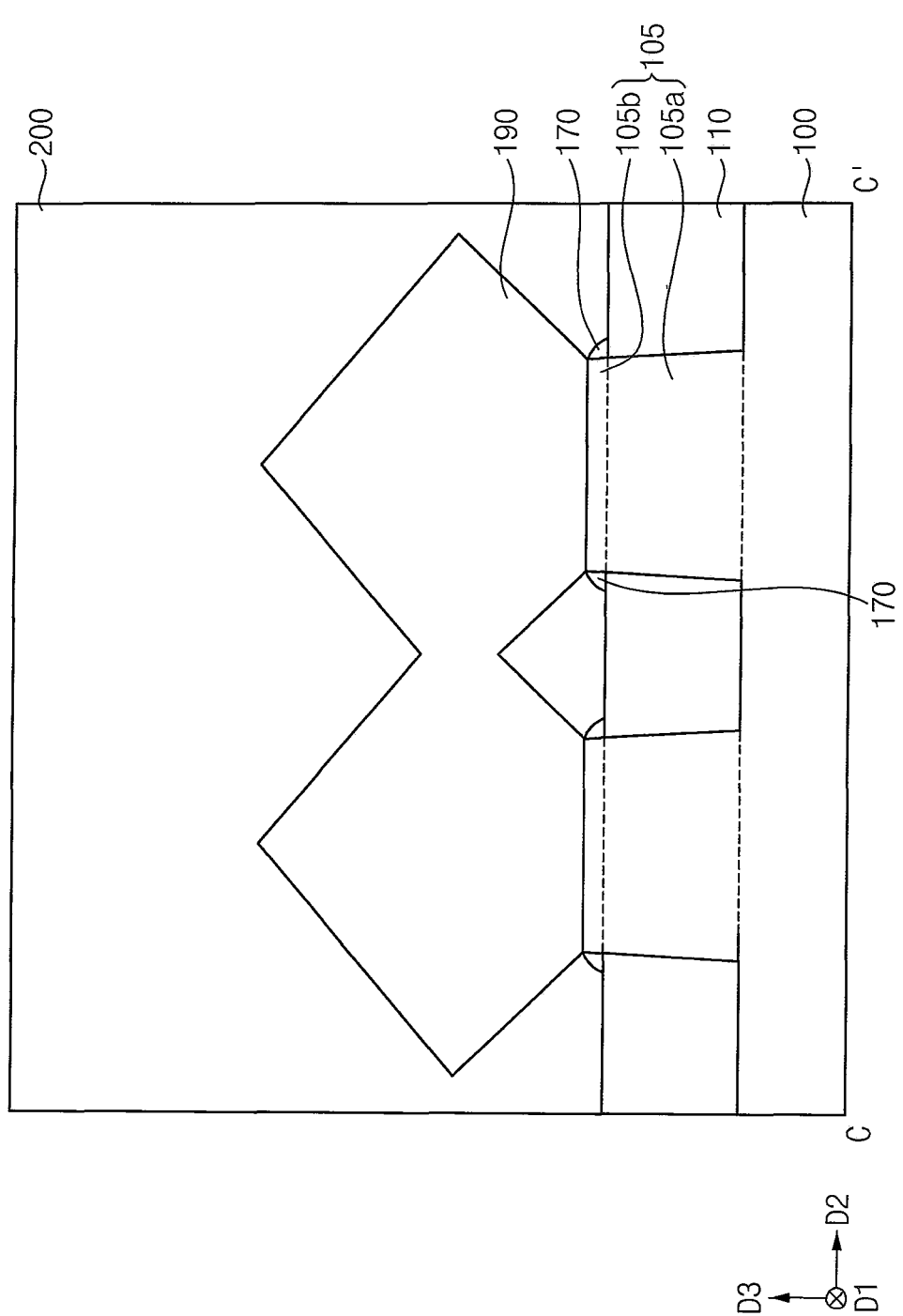

Specifically, FIGS. 6, 12, 16 and 20 are cross-sectional views taken along lines A-A' of corresponding plan views, respectively. FIGS. 7, 9, 11, 13-15 and 17-18 are cross-sectional views taken along lines B-B' of corresponding plan views, respectively. FIGS. 10 and 21 are cross-sectional views taken along lines C-C' of corresponding plan views, respectively.

Figure 5:
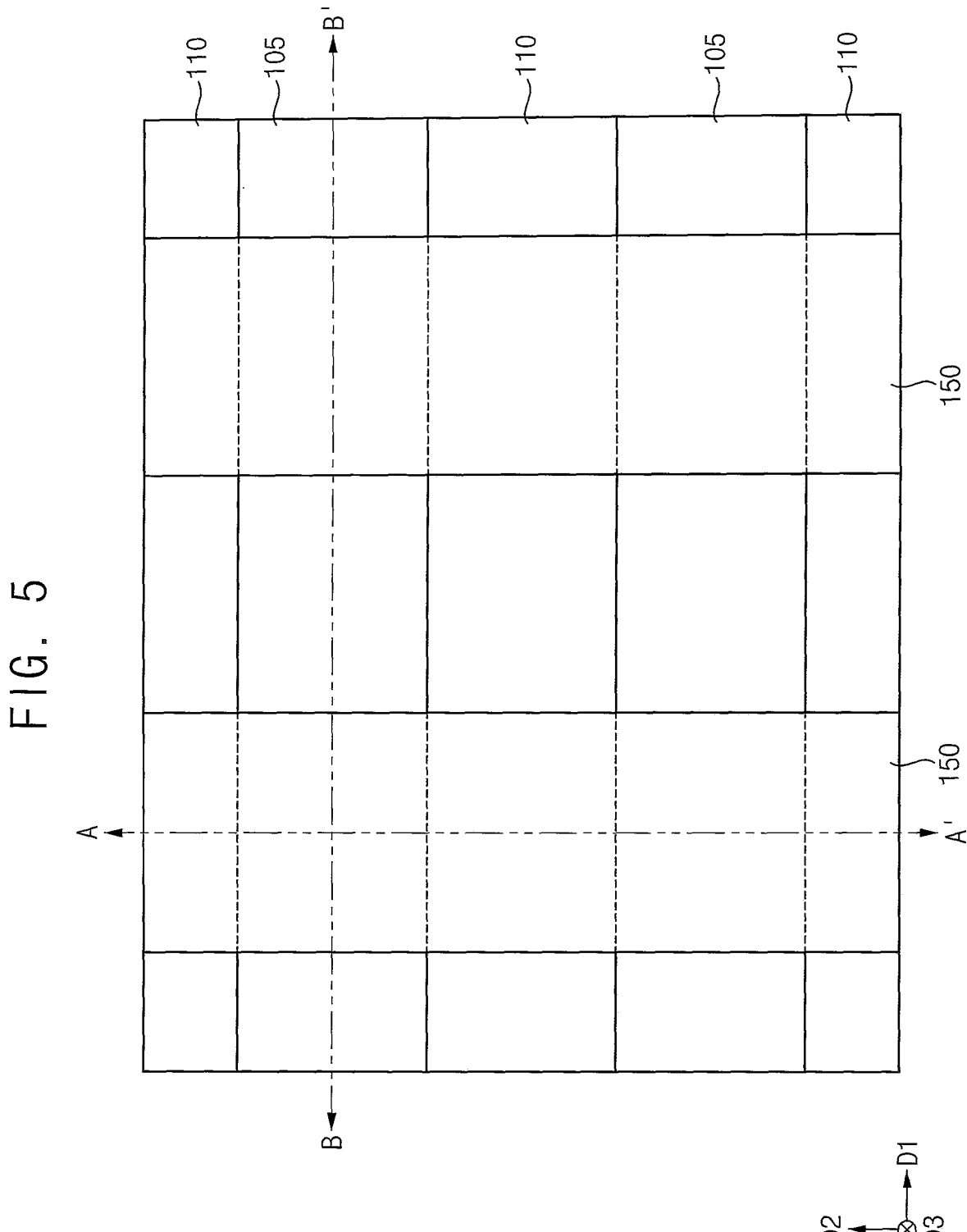
Figure 6:
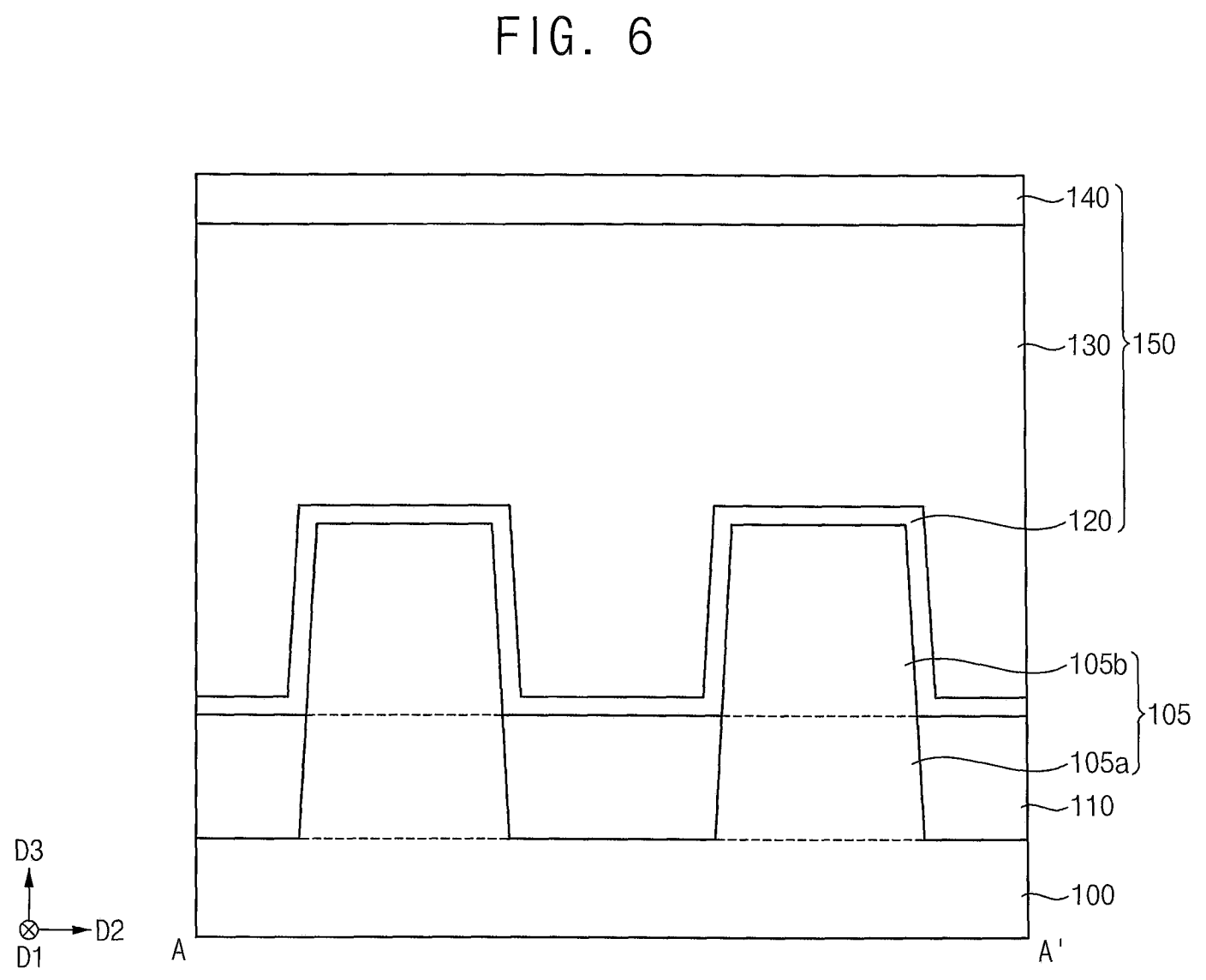
Figure 7:
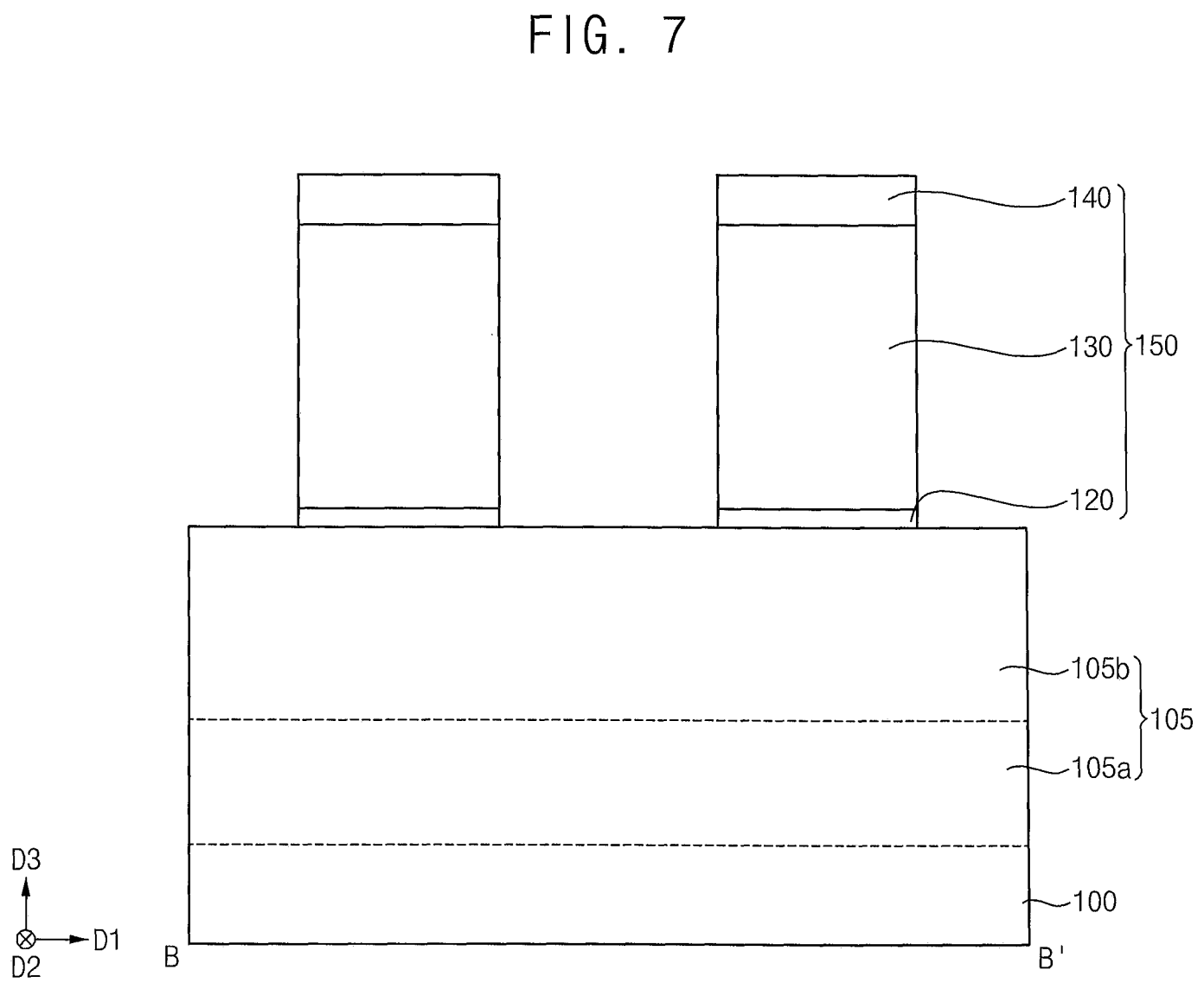

Referring FIGS. 5 to 7, an upper portion of the substrate 100 may be partially etched to form a first trench, and the first isolation pattern 110 may be formed to fill a lower portion of the first trench.

In example embodiments, the first isolation pattern 110 may be formed by forming a first isolation layer on the substrate 100, planarizing the first isolation layer to expose the upper surface of the substrate 100, and removing an upper portion of the first isolation layer to expose an upper portion of the first trench. As the first isolation pattern 110 is formed on the substrate 100, the first active pattern 105 may be formed on the substrate 100.

A first dummy gate structure 150 may be formed on the substrate 100 on which the first active pattern 105 and the first isolation pattern 110 are formed. The first dummy gate structure 150 may include a first dummy gate insulating pattern 120, a first dummy gate electrode 130, and a first dummy gate mask 140, which may be sequentially stacked. As used herein, the term "dummy" is used to refer to a component that has the same or similar structure and shape as other components but does not have a substantial function and exists only as a pattern in the device.

The first dummy gate insulating pattern 120 may include or may be formed of, for example, oxide such as silicon oxide, the first dummy gate electrode 130 may include or may be formed of, for example, polysilicon, and the first dummy gate mask 140 may include or may be formed of, for example, nitride such as silicon nitride.

In example embodiments, the first dummy gate structure 150 may extend in the second direction D2, and a plurality of first dummy gate structures 150 may be spaced apart from each other in the first direction D1.

Figure 9:
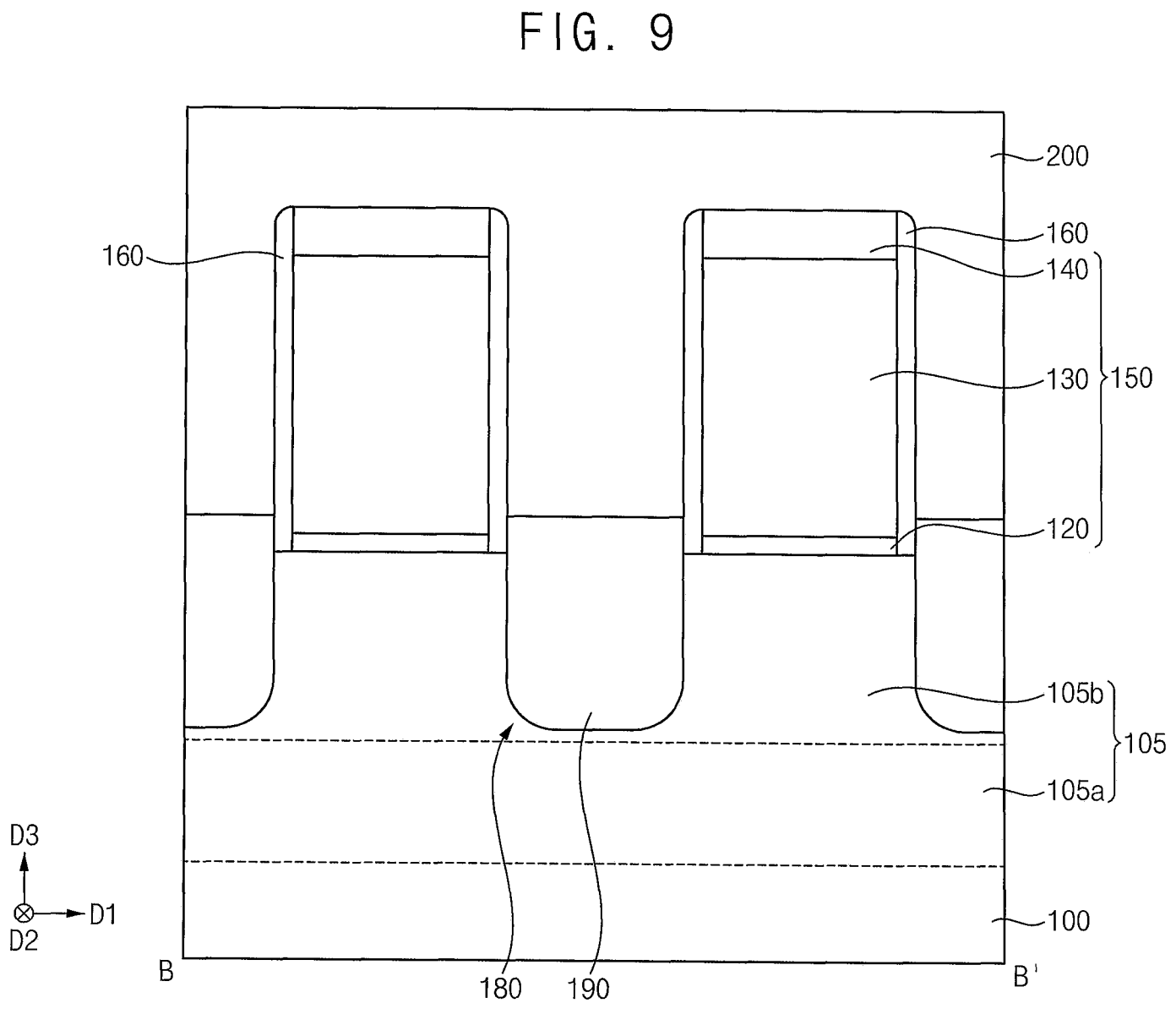

Referring to FIGS. 8 to 10, the first gate spacer 160 may be formed on each of opposite sidewalls in the first direction D1 of the first dummy gate structure 150, and the fin spacer 170 may be formed on each of the opposite sidewalls in the second direction D2 of the first active pattern 105.

The first gate spacer 160 and the fin spacer 170 may be formed by forming a first spacer layer on the substrate 100 on which the first active pattern 105, the first isolation pattern 110, and the first dummy gate structure 150 are formed, and anisotropically etching the first spacer layer. The first gate spacer 160 and the fin spacer 170 may include or may be formed of, for example, nitride such as silicon nitride (SiN), silicon oxynitride (SiON), silicon oxycarbonitride (SiOCN), or the like.

An upper portion of the first active pattern 105 not covered by the first dummy gate structure 150 and the first gate spacer 160 may be etched to form the first recess 180, using the first dummy gate structure 150 and the first gate spacer 160 as an etch mask.

FIG. 9 shows that the first recess 180 is formed by partially removing only the first upper active pattern 105*b*, however, the inventive concept is not limited thereto, and the first recess 180 may be formed by partially removing the first lower active pattern 105*a* as well as the first upper active pattern 105*b*.

In example embodiments, the etching process for forming the first recess 180 and the anisotropic etching process for forming the first spacer layer may be performed in-situ.

A selective epitaxial growth (SEG) process may be performed using the upper surface of the first active pattern 105 exposed by the first recess 180 as a seed layer to form the first source/drain layer 190.

The selective epitaxial growth (SEG) process may be performed using a source gas including, for example, dichlorosilane ($SiH_2Cl_2$) gas, germanium tetrahydride ($GeH_4$) gas, or the like, and thus a single crystal silicon-germanium (SiGe) layer may be formed. A p-type impurity source gas, for example, diborane ($B_2H_6$) gas may also be used to form a single crystal silicon-germanium layer doped with p-type impurities.

The selective epitaxial growth (SEG) process may be performed using a source gas including, for example, disilane ($Si_2H_6$) gas, methylsilane ($SiH_3CH_3$) gas, or the like, and thus a single crystal silicon carbide (SiC) layer may be formed. An n-type impurity source gas, for example, phosphine ($PH_3$) gas may also be used to form a single crystal silicon carbide layer doped with n-type impurities. In an embodiment, the selective epitaxial growth (SEG) process may be formed using a source gas including only, for example, disilane ($Si_2H_6$) gas, together with the n-type impurity source gas to form a single crystal silicon layer doped with n-type impurities.

The first source/drain layer 190 may fill the first recess 180, and may grow upwardly to contact the lower sidewall of the first gate spacer 160. The first source/drain layer 190 may grow not only in a vertical direction but also in a horizontal direction, and may have a shape similar to a pentagon in a cross-section taken along a line extending in the second direction D2. If the distance between the first active patterns 105 adjacent to each other in the second direction D2 is small, the first source/drain layers on the respective upper surfaces of the first active patterns 105 may be partially merged with each other.

The first insulating interlayer 200 may be formed on the substrate 100 on which the first dummy gate structure 150, the first gate spacer 160, the fin spacer 170, the first source/drain layer 190, and the first isolation pattern 110 are formed to have an upper surface higher than an upper surface of the first dummy gate structure 150 and the upper surface of the first gate spacer 160.

Figure 11:
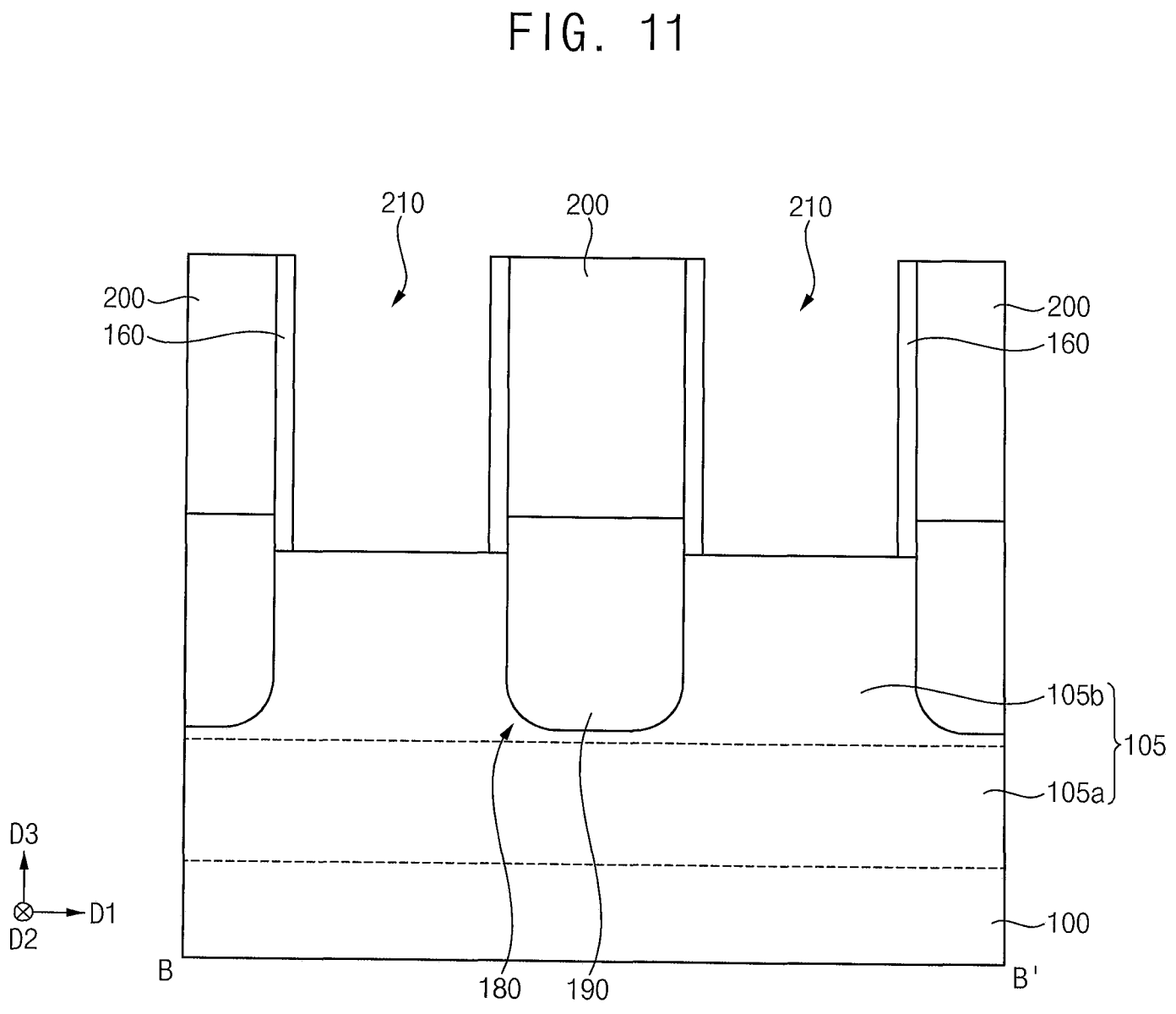

Referring to FIG. 11, a planarization process may be performed to expose an upper surface of the first dummy gate electrode 130 included in the first dummy gate structure 150. In the planarization process, an upper portion of the first insulating interlayer 200 and the first dummy gate mask 140 included in the first dummy gate structure 150 may be removed, and an upper portion of the first gate spacer 160 may also be removed.

The exposed first dummy gate electrode 130 and the first dummy gate insulating pattern 120 may be removed to form a first opening 210 exposing the upper surface of the first active pattern 105 and an upper surface of the first isolation pattern 110.

In example embodiments, the first dummy gate electrode 130 and the first dummy gate insulating pattern 120 may be removed by sequentially performing a dry etching process and a wet etching process. The wet etching process may be performed using, for example, hydrofluoric acid as an etchant.

Figure 12:
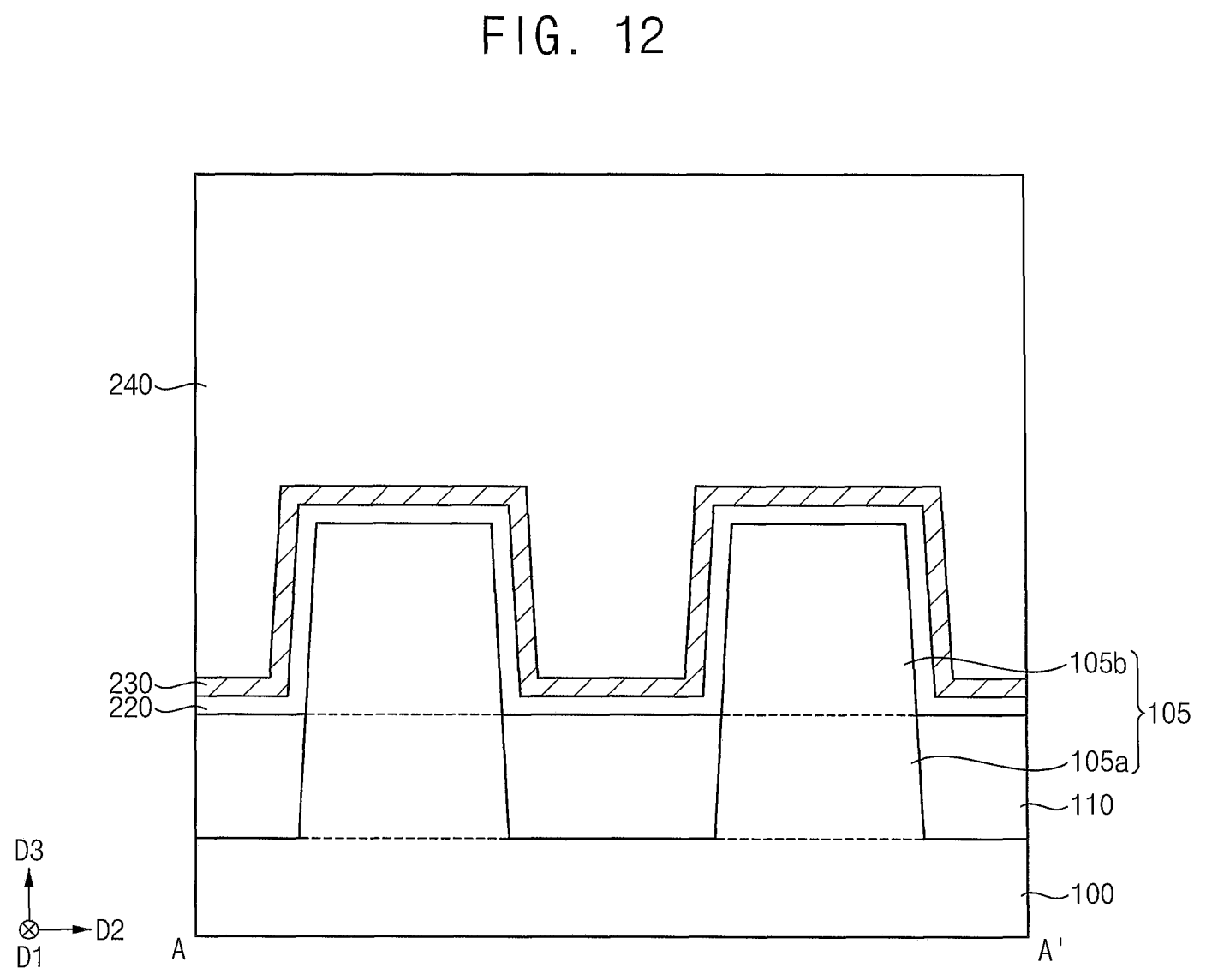

Referring to FIGS. 12 and 13, a first gate insulating layer 220 and a first conductive layer 230 may be sequentially stacked on a lower surface and a sidewall of the first opening 210 and the upper surface of the first insulating interlayer 200, and a first sacrificial layer 240 may be formed on the first conductive layer 230 to fill a remaining portion of the first opening 210.

The first sacrificial layer 240 may include or may be, for example, a spin-on-hardmask (SOH) layer, an amorphous carbon layer (ACL), or the like.

Referring to FIG. 14, an upper portion of the first sacrificial layer 240 may be removed by, for example, a first ashing process and/or a first stripping process to form a first sacrificial pattern 245 having an upper surface lower than a top of the first opening 210, and thus a surface of an upper portion of the first conductive layer 230 may be exposed.

The exposed upper portion of the first conductive layer 230, and upper portions of the first gate insulating layer 220 and the first gate spacer 160 at substantially the same level as the exposed upper portion of the first conductive layer 230 may be further removed by a first etching process, for example, a wet etching process or a dry etching process. For example, the first gate spacer 160 may be partially removed by a dry etching process using carbon tetrafluoride ($CF_4$), oxygen ($O_2$), and argon (Ar).

The first conductive layer 230 and the first gate insulating layer 220 may be transformed into the first conductive pattern 235 and the first gate insulating pattern 225, respectively, by the first etching process. The upper surfaces of the first conductive pattern 235 and the first gate spacer 160, and an upper surface of the first gate insulating pattern 225, may be substantially coplanar with an upper surface of the first sacrificial pattern 245.

A second recess 250 may be formed on the upper surfaces of the first sacrificial pattern 245, the first conductive pattern 235, the first gate insulating pattern 225, and the first gate spacer 160 in the first opening 210, by the first ashing process (and/or the first stripping process) and the first etching process.

Figure 15:
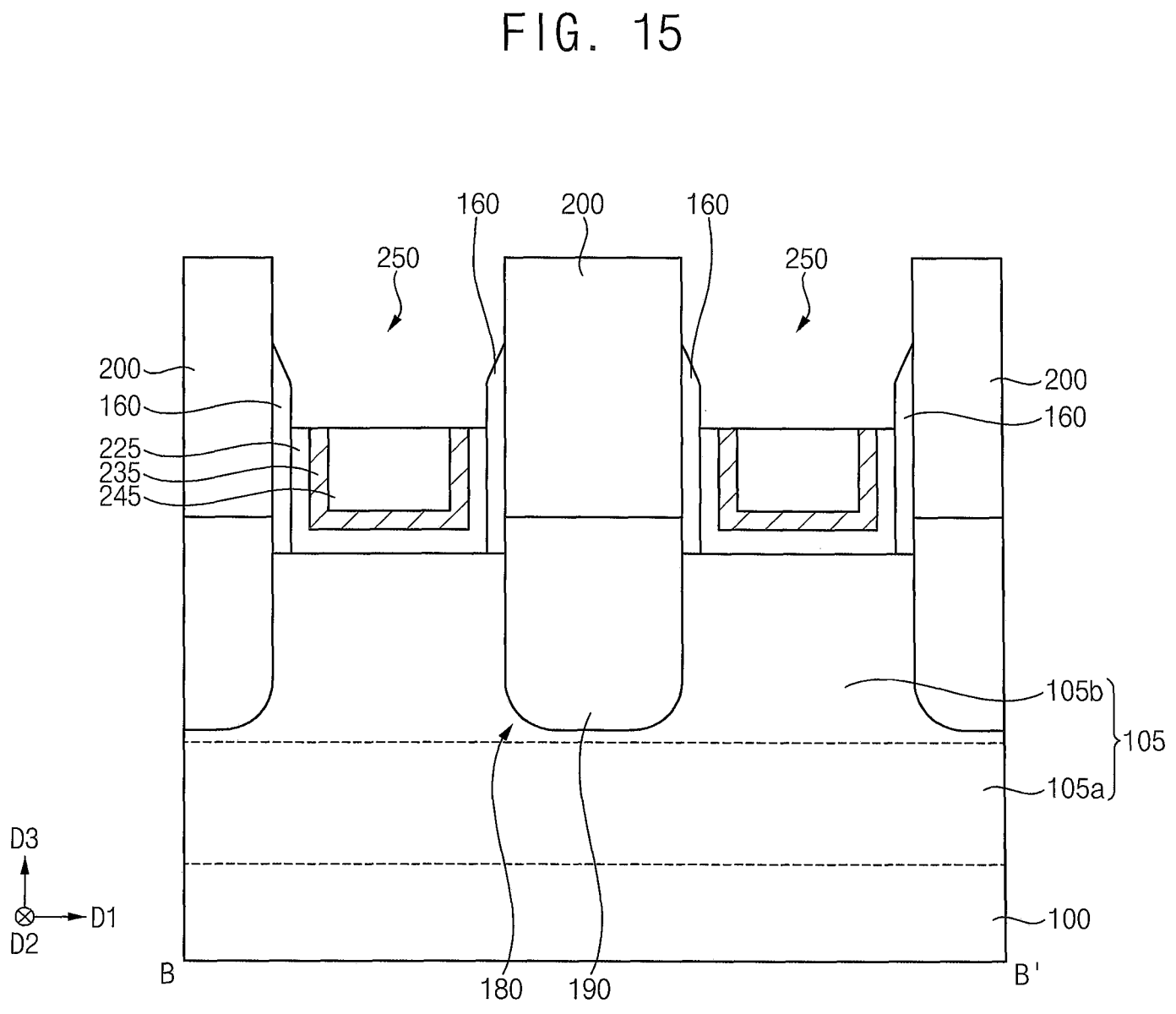

Referring to FIG. 15, an upper portion of the first sacrificial pattern 245 may be further removed by, for example, a second ashing process and/or a second stripping process, and a portion of the first conductive pattern 235 exposed by the second ashing process and/or the second stripping process, and a portion of the first gate insulating pattern 225 at substantially the same level as the first conductive pattern 235 may be further removed by, a second etching process, for example, a wet etching process or a dry etching process.

After the second etching process, upper surfaces of the first conductive pattern 235 and the first gate insulating pattern 225 may be substantially coplanar with an upper surface of the first sacrificial pattern 245.

During a time when the portions of the first conductive pattern 235 and the first gate insulating pattern 225 are removed by the second etching process, a portion the first gate spacer 160 adjacent to the first gate insulating pattern 225 may be partially removed.

In example embodiments, a relatively high portion of the first gate spacer 160 may be removed more than a relatively low portion of the first gate spacer 160 in the second etching process. Accordingly, a portion of the first gate spacer 160 remaining after the second etching process, which is higher than the upper surface of the first sacrificial pattern 24, may include a portion having a thickness gradually increasing from a top to a bottom thereof in the third direction D3 and a portion having a constant thickness in the third direction D3. Thus, an upper portion of the first gate spacer 160 may have a sidewall inclined with respect to the upper surface of the substrate 100, and a lower portion of the first gate spacer 160 may have a sidewall substantially perpendicular to the upper surface of the substrate 100. In an embodiment, the lower portion of the first gate spacer 160 may protrude upwardly from an upper surface of the first sacrificial pattern 245, and a boundary between the upper portion and the lower portion of the first gate spacer 160 may be positioned higher than the upper surface of the first sacrificial pattern 245.

As the first sacrificial pattern 245, the first conductive pattern 235, the first gate insulating pattern 225 and the first gate spacer 160 are partially removed by the second ashing process (and/or the second stripping process) and the second etching process, the second recess 250 may be enlarged downwardly, and an upper portion of the second recess 250 from which the first gate spacer 160 is removed may have a width greater than a lower portion of the second recess 250.

Figure 16:
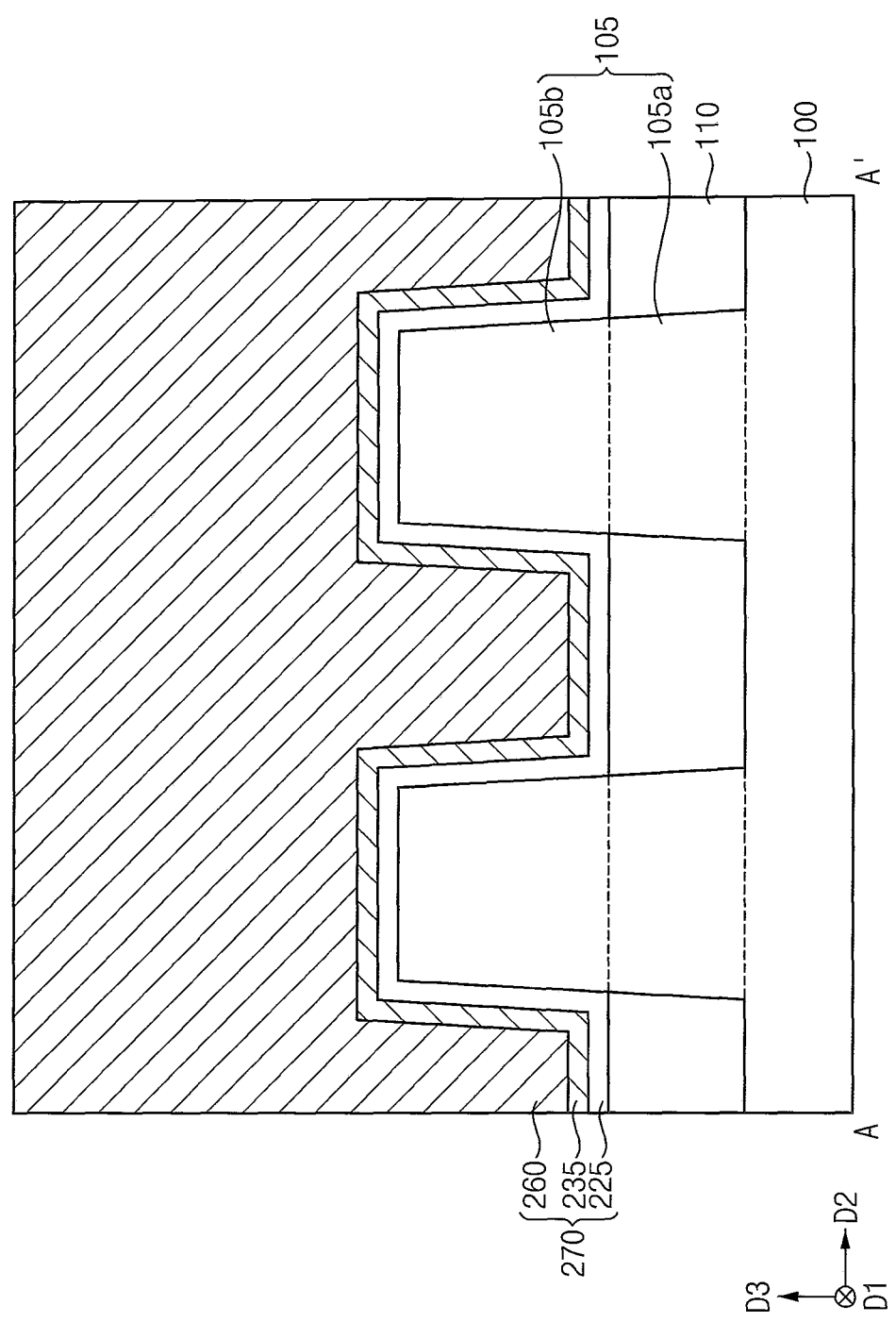
Figure 17:
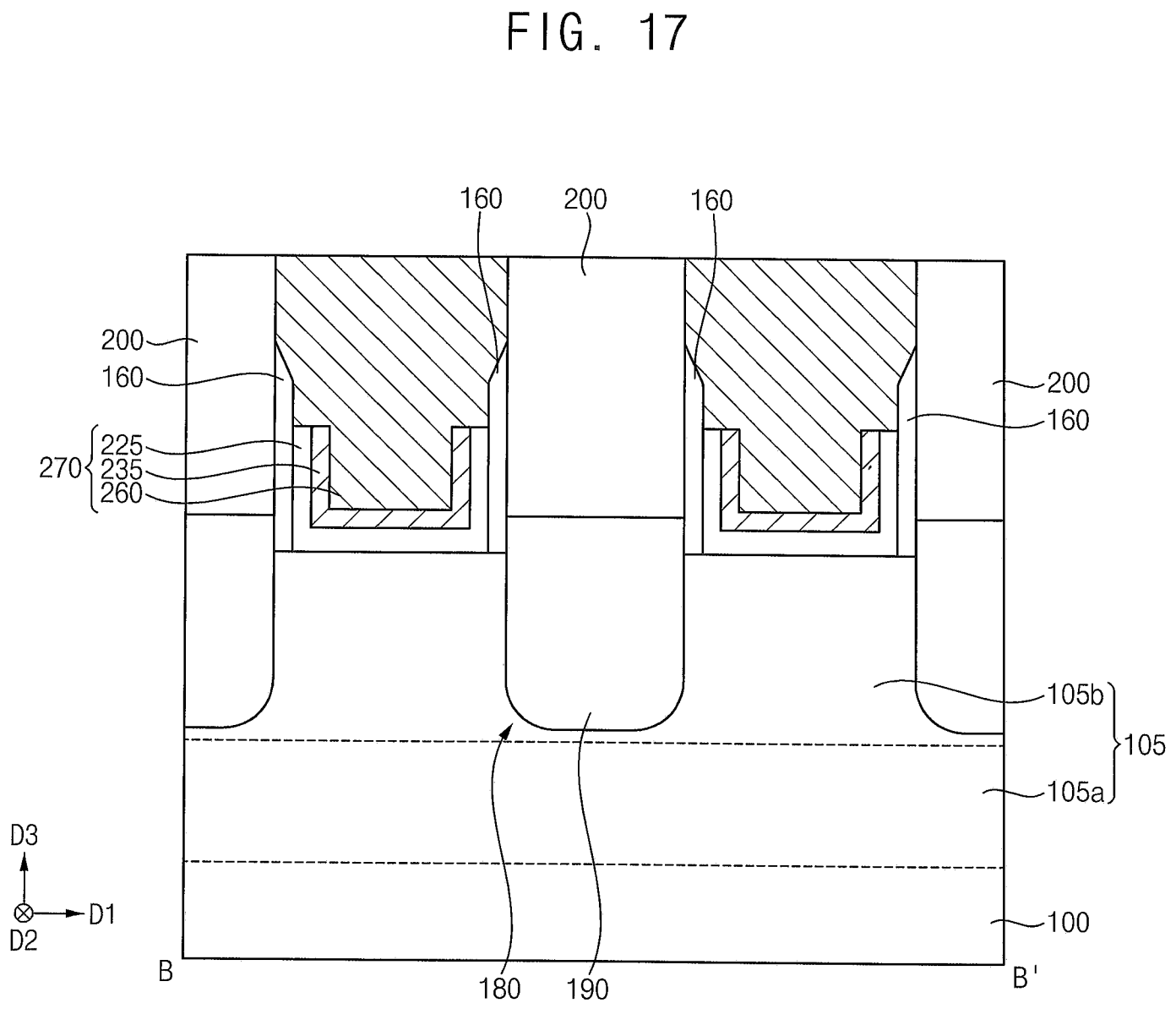

Referring to FIGS. 16 and 17, a remaining of the first sacrificial pattern 245 may be removed to expose an upper surface of the first conductive pattern 235, and thus the second recess 250 may be further enlarged downwardly.

A second conductive layer may be formed on the first conductive pattern 235, the first gate insulating pattern 225, the first gate spacer 160 and the first insulating interlayer 200 to fill the second recess 250, and may be planarized to expose the upper surface of the first insulating interlayer 200.

The planarization process may include, for example, a chemical mechanical polishing (CMP) process and/or an etch-back process.

By the planarization process the second conductive pattern 260 may be formed in the second recess 250. Accordingly, the first gate structure 270 including the first gate insulating pattern 225, the first conductive pattern 235 and the second conductive pattern 260, and the first gate spacer 160 covering a lower sidewall of the first gate structure 270 may be formed in the first opening 210.

In example embodiments, the second conductive pattern 260 may include or may be formed of, for example, metal such as tungsten, aluminum, copper, titanium, or the like, a metal nitride such as titanium nitride, or a metal alloy carbide such as titanium aluminum carbide.

The upper portion of the second conductive pattern 260 may have a greater width than the lower portion of the second conductive pattern 260. The sidewall of the upper portion of the second conductive pattern 260 may not be covered by the first gate spacer 160, but may be in contact with a sidewall of the first insulating interlayer 200.

Figure 18:
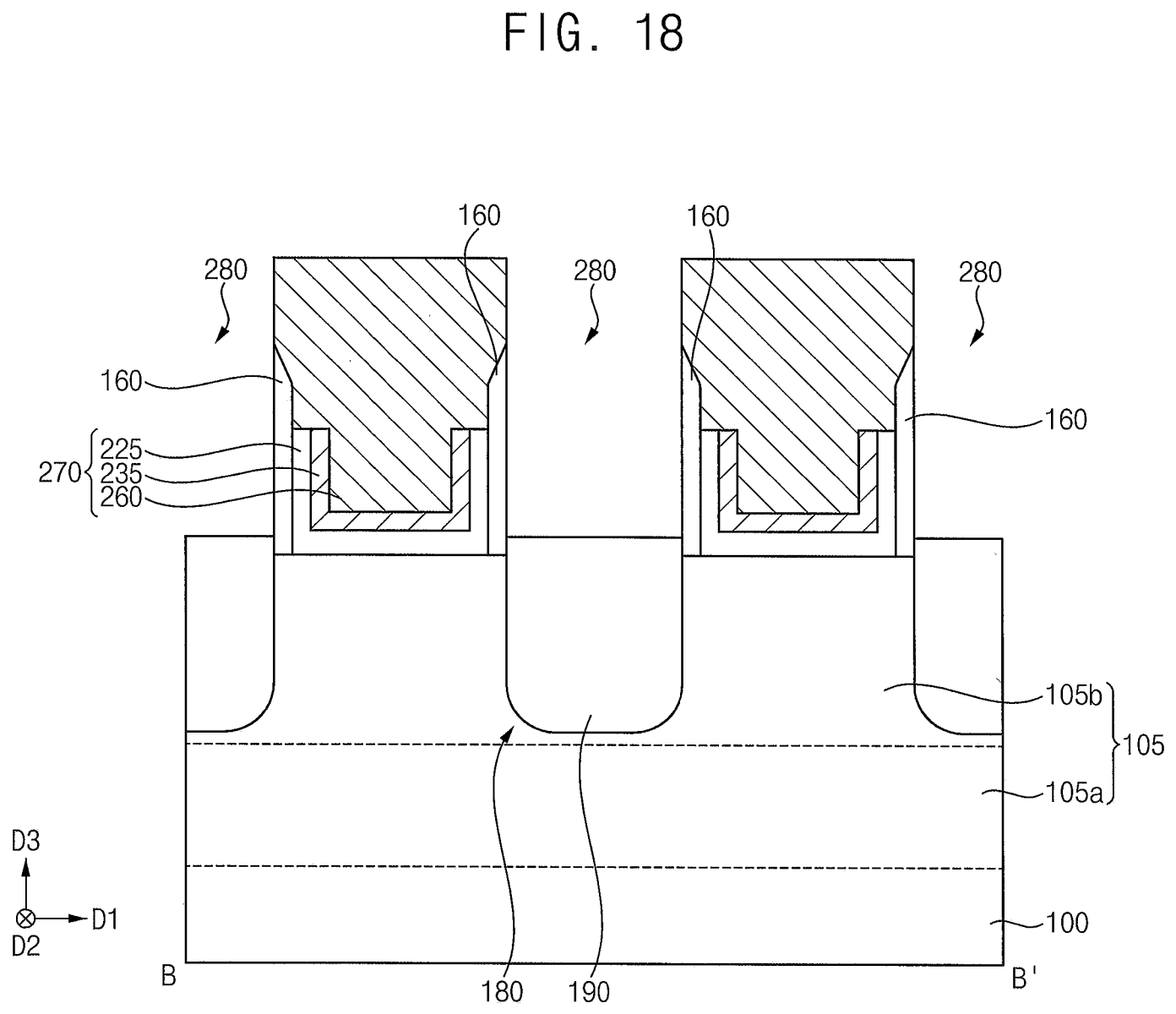

Referring to FIG. 18, a portion of the first insulating interlayer 200 between the first gate structure 270 and the first gate spacer 160 may be removed to form a second opening 280 exposing the upper surface of the first source/drain layer 190.

In example embodiments, the first insulating interlayer 200 may be removed by a dry etching process using the second conductive pattern 260 including metal as an etch mask. In the dry etching process, the second conductive pattern 260 including metal may have high etch selectivity with respect to the first insulating interlayer 200 including, for example, oxide, and thus the second conductive pattern 260 may hardly be removed during a time when the first insulating interlayer 200 is removed during the dry etching process.

Accordingly, the second opening 280, which may be formed to be self-aligned to the first gate spacer 160 may have a sidewall substantially perpendicular to the upper surface of the substrate 100.

If a capping pattern including an insulating nitride such as silicon nitride is formed on the first conductive pattern 235 instead of the second conductive pattern 260 including metal, the first insulating interlayer 200 including oxide may have low etch selectivity with respect to the capping pattern and the first gate spacer 160 including an insulating nitride when compared to the second conductive pattern 260 including metal in a dry etching process for forming the second opening 280 that is self-aligned to the first gate spacer 160.

Thus, during the dry etching process, a considerable amount of the capping pattern and the first gate spacer 160 may be removed, and in particular, the first gate spacer 160 may be etched to have an inclined sidewall or may be further etched. Accordingly, when the first contact plug 290 (refer to FIG. 21) including a conductive material is formed in the second opening 280 formed by the dry etching process, the first contact plug 290 and the first gate structure 270 may contact each other, or the first gate spacer 160 between the first contact plug 290 and the first gate structure 270 may have a very thin thickness, so that the first contact plug 290 and the first gate structure 270 may be electrically shorted.

However, in example embodiments, the second conductive pattern 260 including metal may be formed on the first conductive pattern 235, and the upper portion of the second conductive pattern 260 may have a greater width than the lower portion of the second conductive pattern 260 so as to cover the upper surface of the first gate spacer 160 under the upper portion of the second conductive pattern 260. During the dry etching process for forming the second opening 280 which is self-aligned to the first gate spacers 160, the second conductive pattern 260 including the metal may serve as an etch mask to remove the first insulating interlayer 200, and thus the second conductive pattern 260 may hardly be removed during a time when the first insulating interlayer 200 is removed, due to the high etch selectivity between the second conductive pattern 260 and the first insulating interlayer 200. The first gate spacer 160 whose an upper surface is covered by the second conductive pattern 260 may hardly be damaged during the dry etching process.

Accordingly, when the first contact plug 290 including a conductive material is formed in the second opening 280, the first gate spacer 160 having a sufficient thickness may remain between the first gate structure 270 and the first contact plug 290 to prevent or reduce the possibility of an electrical short therebetween.

Figure 20:
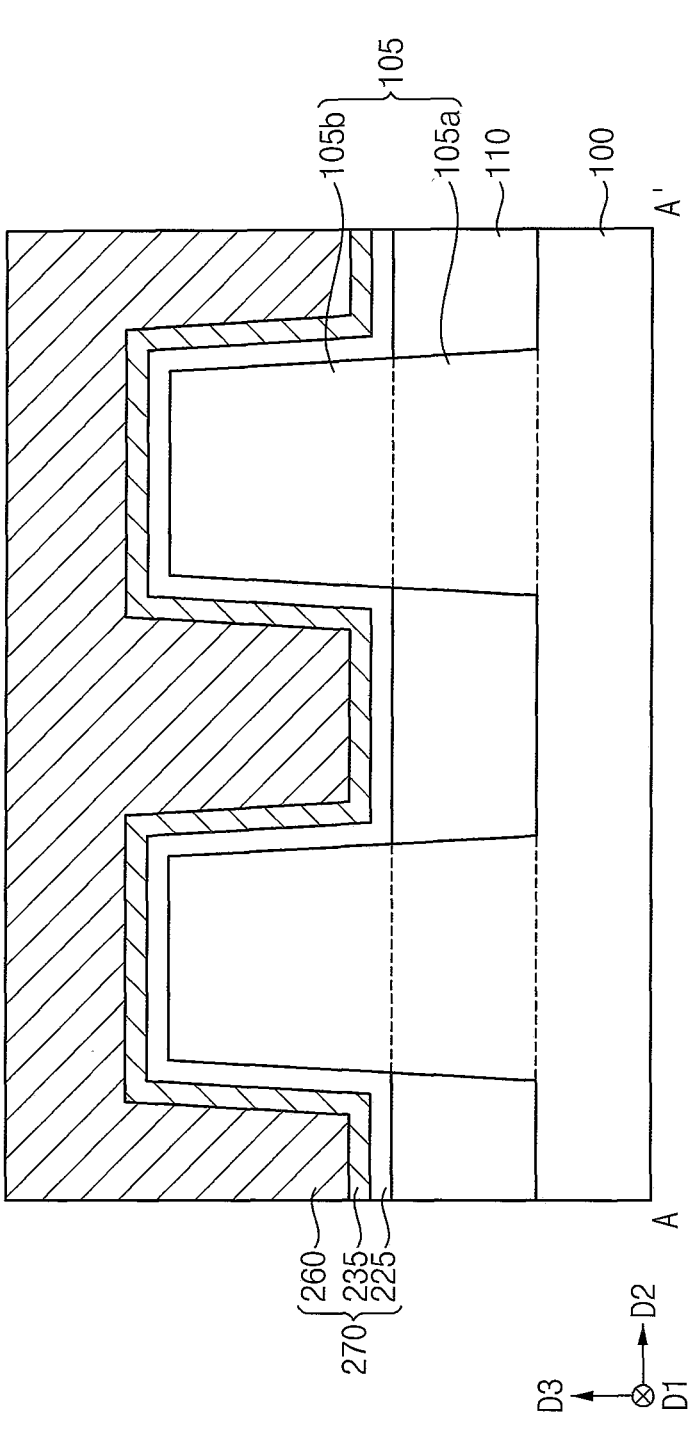
Figure 21:
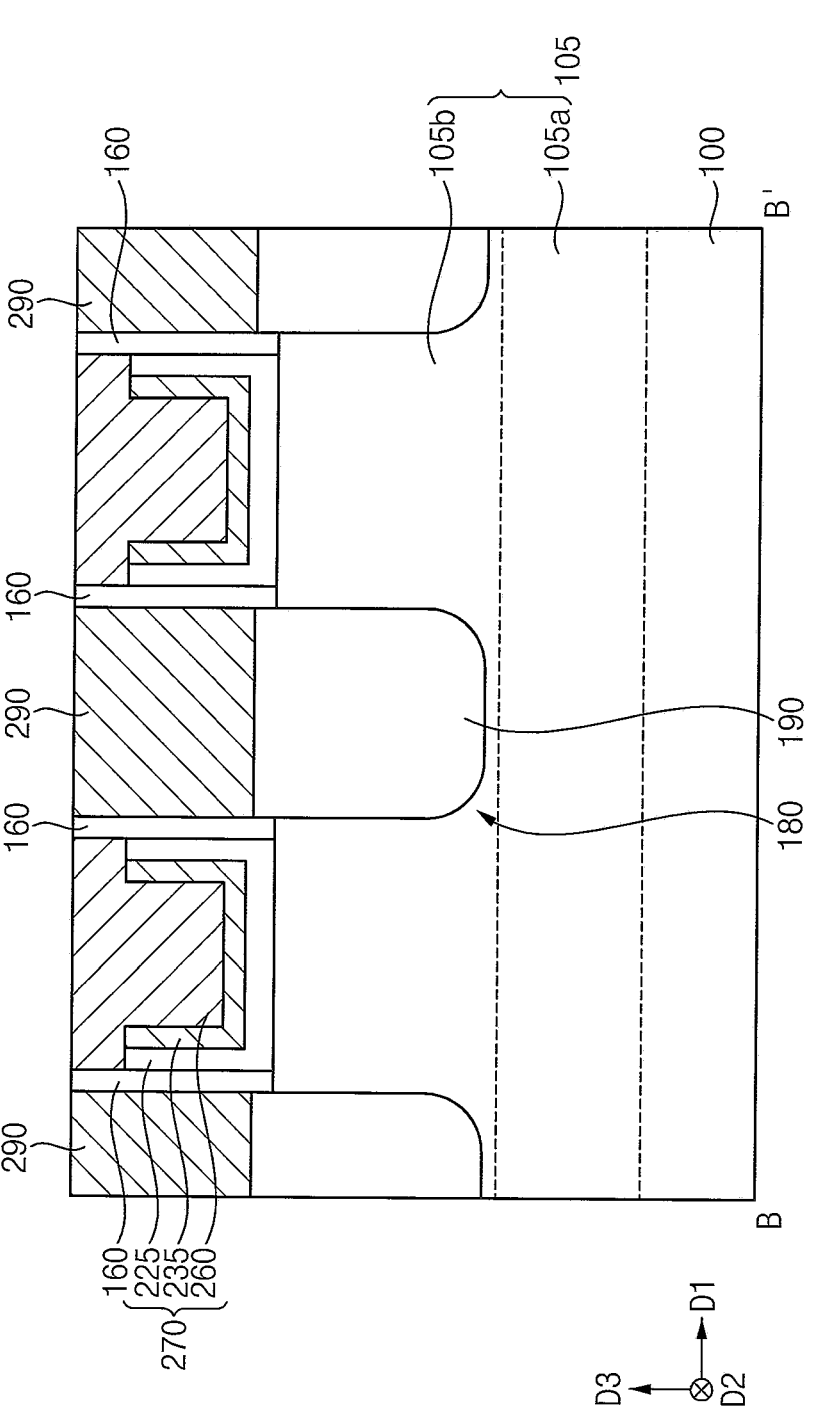

Referring to FIGS. 19 to 21, a first contact plug layer may be formed on the upper surfaces of the first source/drain layer 190 and the second conductive pattern 260 to fill the second opening 280. An upper portion of the first contact plug layer, and the upper portions of the second conductive pattern 260 and the first gate spacer 160 may be planarized.

Accordingly, the first contact plug 290 may be formed in the second opening 280. During a time when the planarization process is performed, the upper portion of the first gate spacer 160 including the inclined sidewall may be removed, and thus the first gate spacer 160 between the first contact plug 290 and the first gate structure 270 may have substantially the same thickness in the third direction D3.

In an example embodiment, the first contact plug 290 may include the third conductive pattern and the first barrier pattern. The first barrier pattern may cover the bottom and the sidewall of the third conductive pattern and may include or may be formed of, for example, a metal nitride.

Referring back to FIGS. 1 to 4, the second insulating interlayer 300 may be formed on the first gate structure 270, the first gate spacer 160, the first contact plug 290 and the first insulating interlayer 200, and the second contact plug 310 contacting an upper surface of the first gate structure 270 and the first via 315 contacting an upper surface of the first contact plug 290 may be formed through the second insulating interlayer 300.

The manufacturing of the semiconductor device may be completed by the above-described processes.

Figure 22:
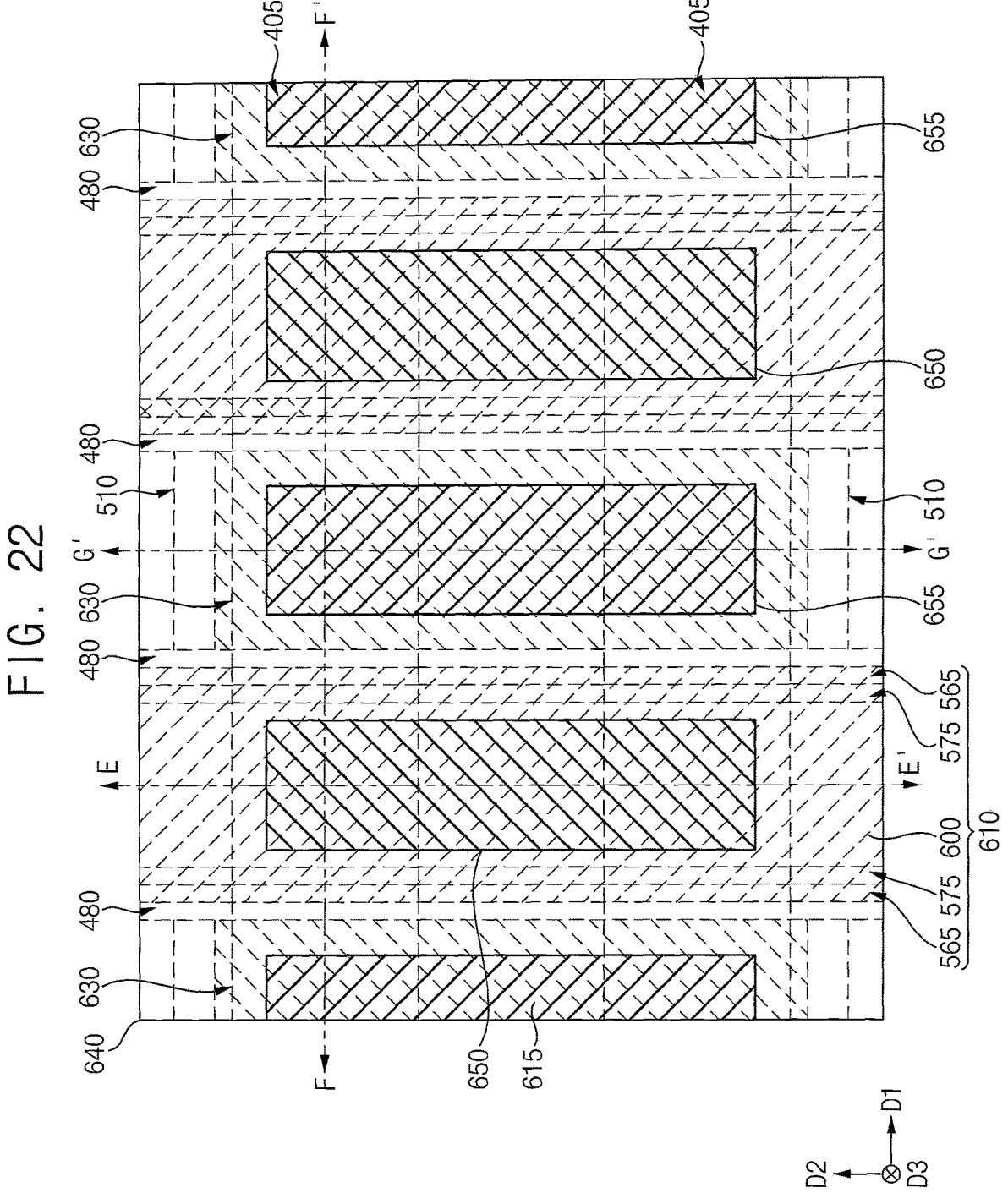
FIGS. 22 to 25 are plan views and cross-sectional views illustrating a semiconductor device in accordance with example embodiments.
Figure 23:
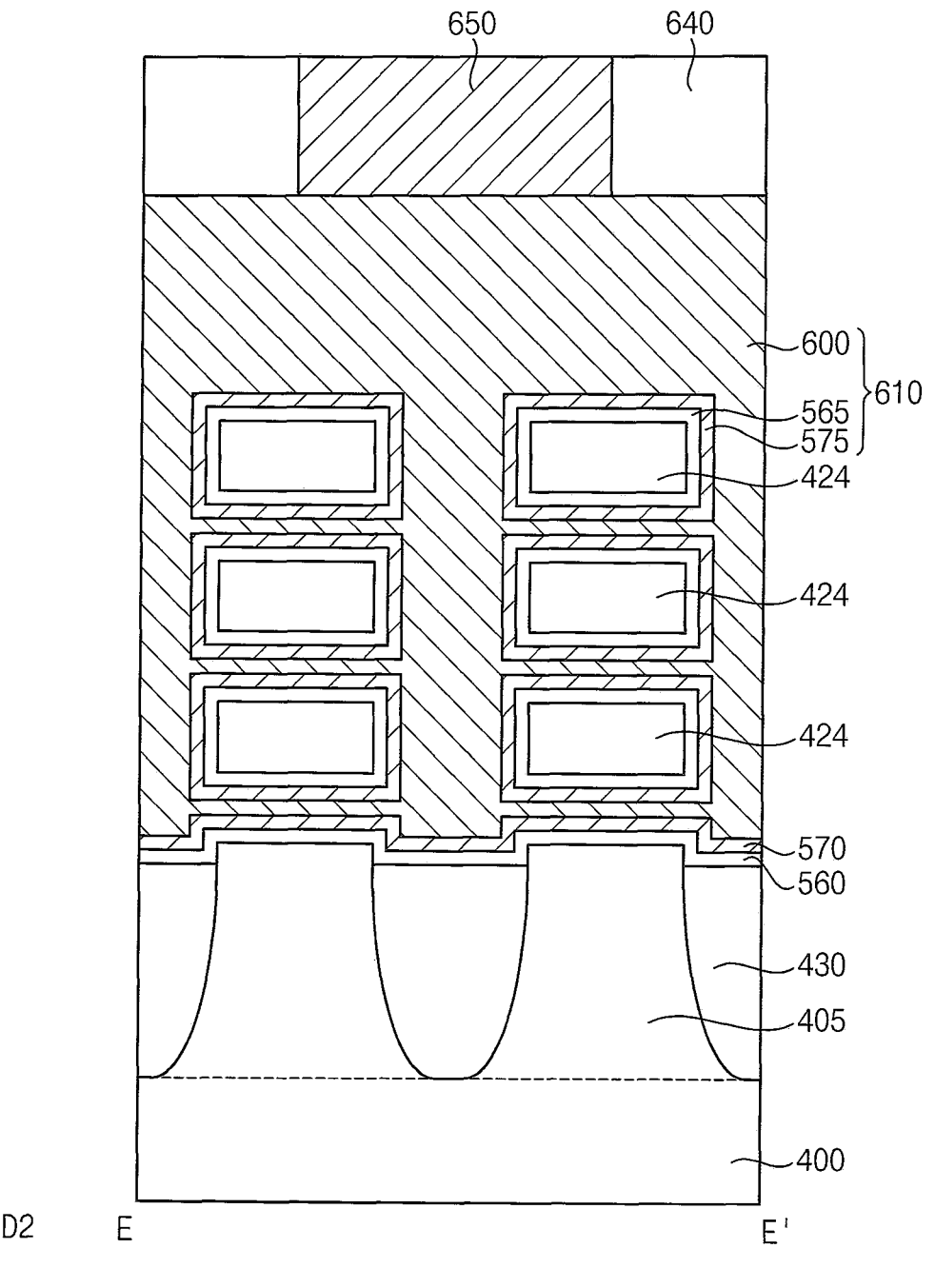
Figure 24:
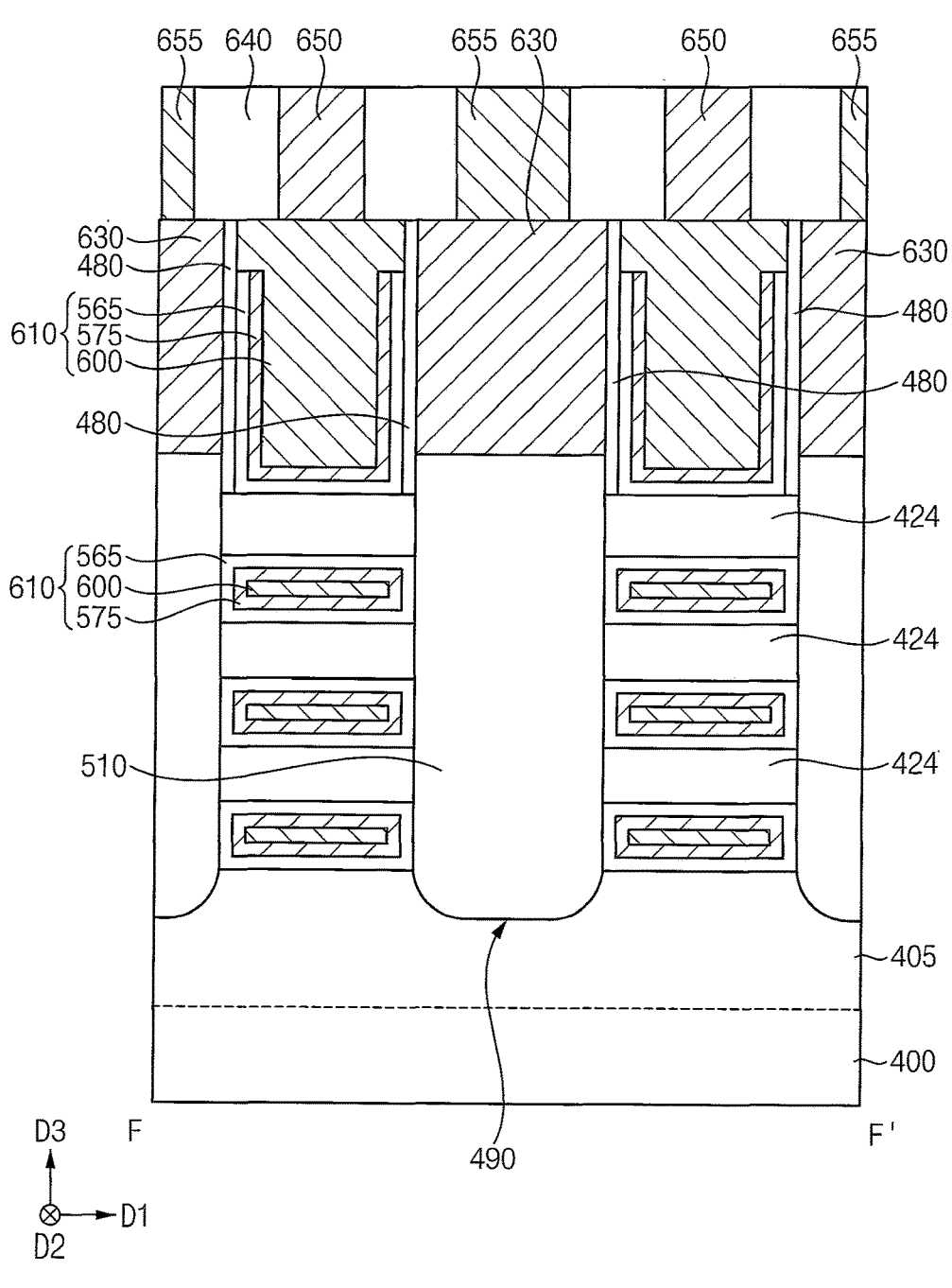
Figure 25:
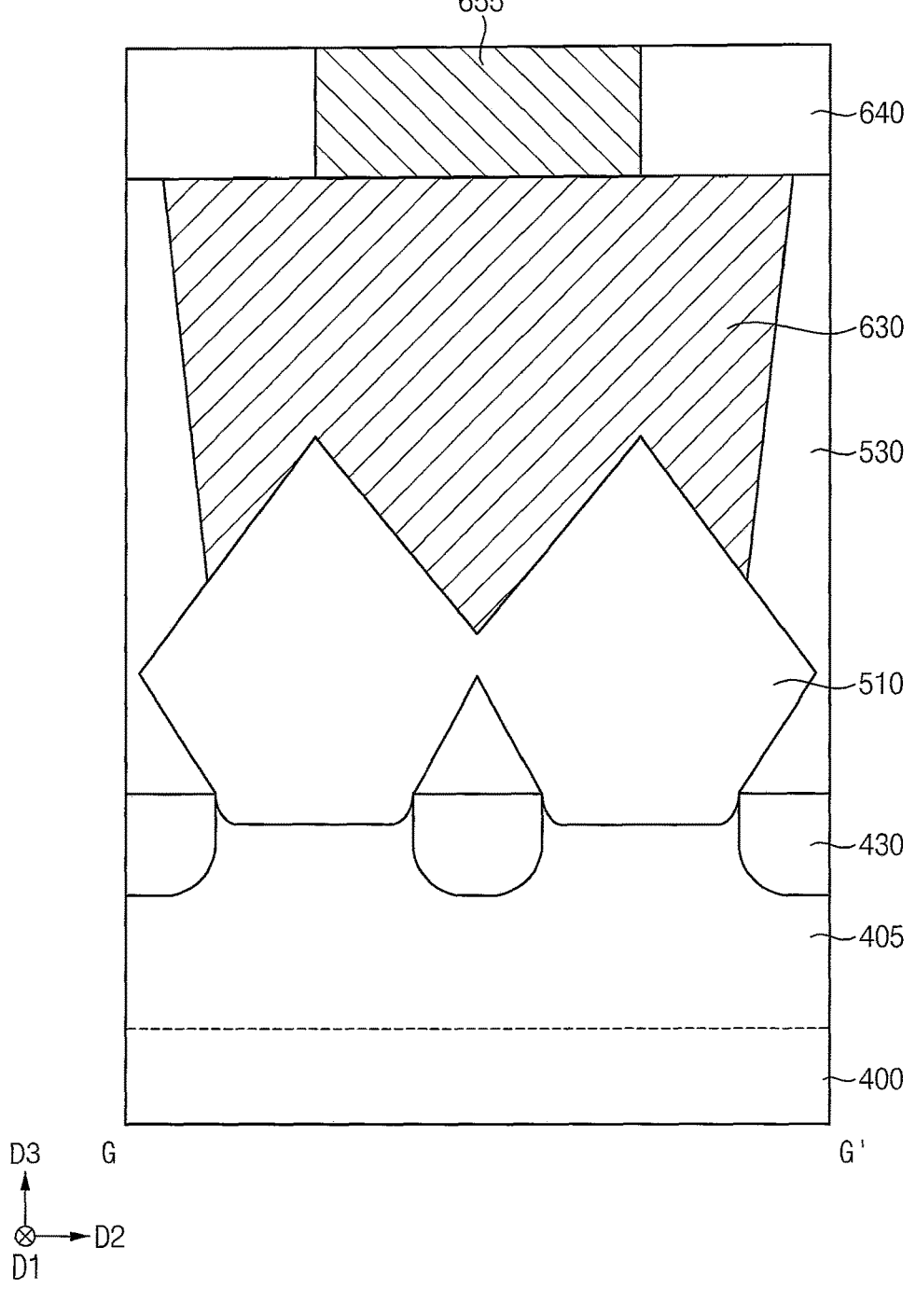

FIGS. 22 to 25 are a plan view and cross-sectional views illustrating a semiconductor device in accordance with example embodiments. Specifically, FIG. 22 is a plan view of a semiconductor device, FIG. 23 is a cross-sectional view taken along line E-E' of FIG. 22, FIG. 24 is a cross-sectional view taken along line F-F' of FIG. 22, and FIG. 25 is a cross-sectional view taken along line G-G' of FIG. 22.

This semiconductor device may include elements substantially the same as or similar to the elements illustrated with reference to FIGS. 1 to 4, and repeated explanations of the elements of the semiconductor device are omitted herein.

As described below, the semiconductor device may be a multi-bridge channel Field Effect Transistor (MBCFET) including a plurality of semiconductor patterns 424 spaced apart from each other in the third direction D3. Each semiconductor pattern of the plurality of semiconductor patterns may serve as a channel. Thus, other elements except for the semiconductor patterns 424 may have structures and functions substantially the same as or similar to those of the corresponding elements included in the finFET illustrated with reference to FIGS. 1 to 4, and detailed descriptions thereof are omitted herein.

Referring to FIGS. 22 to 25, the semiconductor device may include a second active pattern 405, a second isolation pattern 430, a second gate structure 610, the semiconductor patterns 424, a second source/drain layer 510, a second gate spacer 480, third and fourth contact plugs 630 and 650, a second via 655, and fourth and fifth insulating interlayers 530 and 640 on the substrate 100.

The second active pattern 405 and the second isolation pattern 430 may correspond to the first active pattern 105 and the first isolation pattern 110, respectively, of FIGS. 1 to 4.

The semiconductor patterns 424 may be spaced apart from each other in the third direction D3 from an upper surface of the second active pattern 405, and each of the semiconductor patterns 424 may extend in the first direction D1 to a given length. FIGS. 23 and 24 show that the semiconductor patterns 424 are disposed in three levels, however, the inventive concept is not limited thereto, and the semiconductor patterns 242 may be disposed in more than or less than three levels.

FIGS. 23 and 24 show that two of the semiconductor patterns 424 are spaced apart from each other in the first direction D1 at each level on the second active pattern 405 extending in the first direction D1, however, the inventive concept is not limited thereto, and more than two semiconductor patterns 424 may be spaced apart from each other in the first direction D1.

In example embodiments, each of the semiconductor patterns 424 may be a nano-sheet or a nano-wire including a semiconductor material such as silicon or germanium. In example embodiments, each of the semiconductor patterns 424 may serve as a channel of a transistor including the semiconductor patterns 424, and thus may be referred to as a channel.

The second gate structure 610 and the second gate spacer 480 may correspond to the first gate structure 270 and the first gate spacer 160, respectively, of FIGS. 1 to 4.

Thus, the second gate structure 610 may extend in the second direction D2 on the second active pattern 405 and the second isolation pattern 430, and may include a second gate insulating pattern 565, a fourth conductive pattern 575 and a fifth conductive pattern 600 on the second gate insulating pattern 565 and the fourth conductive pattern 575. The fourth and fifth conductive patterns 575 and 600 may form a second gate electrode.

The second gate structure 610 may surround a central portion in the first direction D1 of each of the semiconductor patterns 424, and may cover upper and lower surfaces and opposite sidewalls in the second direction D2 of the central portion of each of the semiconductor patterns 424.

The second gate insulating pattern 565 and the fourth conductive pattern 575 may be sequentially formed on a surface of each of the semiconductor patterns 424, the upper surface of the second active pattern 405, an upper surface of the second isolation pattern 430, a portion of a sidewall of the second source/drain layer 510 and an inner sidewall of the second gate spacer 480. The fifth conductive pattern 600 may be formed in a first space between the semiconductor patterns 424 spaced apart from each other in the third direction D3, a second space between a lowermost one of semiconductor patterns 424 and the second active pattern 405, and a third space between the second gate spacers 480 spaced apart from each other in the first direction D1 on an uppermost one of the semiconductor patterns 424.

Hereinafter, a portion of the second gate structure 610 in the third space may be referred to as a first portion thereof. Accordingly, the second gate spacers 480 may be formed on opposite sidewalls in the first direction D1 of the first portion of the second gate structure 610. In example embodiments, an upper surface of the second gate spacer 480 may be substantially coplanar with an upper surface of a portion of the fifth conductive pattern 600 included in the first portion of the second gate structure 610.

In example embodiments, the portion of the fifth conductive pattern 600 included in the first portion of the second gate structure 610 may contain a lower portion having a relatively small width in the first direction D1 and an upper portion contacting the lower portion and having a relatively large width in the first direction D1. In an embodiment, the lower portion of the fifth conductive pattern 600 included in the first portion of the second gate structure 610 may have a first width in the first direction D1, and the upper portion of the fifth conductive pattern 600 may have a second width, greater than first width, in the first direction D1.

In example embodiments, a portion of the fourth conductive pattern 575 included in the first portion of the second gate structure 610 may cover a lower surface and a sidewall of the lower portion of the fifth conductive pattern 600, and a portion of the second gate insulating pattern 565 included in the first portion of the second gate structure 610 may cover a lower surface and an outer sidewall of the portion of the fourth conductive pattern 575 included in the first portion of the second gate structure 610.

In example embodiments, uppermost surfaces of the portions of the second gate insulating pattern 565 and the fourth conductive pattern 575 included in the first portion of the second gate structure 610 may be substantially coplanar with each other, and may contact a lower surface of the upper portion of the fifth conductive pattern 600 included in the first portion of the second gate structure 610.

The second source/drain layer 510 may be formed on a portion of the second active pattern 405 adjacent to the second gate structure 610, and may contact opposite sidewalls in the first direction D1 of the semiconductor patterns 424 at a plurality of levels to be electrically connected thereto. An upper portion of the second source/drain layer 510 may partially contact an outer sidewall of the second gate spacer 480.

In an example embodiment, the second source/drain layer 510 may include or may be formed of single crystal silicongermanium including p-type impurities. In an embodiment, the second source/drain layer 510 may include or may be formed of single crystal silicon including n-type impurities or single crystal silicon carbide including n-type impurities.

The third contact plug 630 may contact an upper surface of the second source/drain layer 510. In an example embodiment, the third contact plug 630 may include a sixth conductive pattern formed on the second source/drain layer 510 and a second barrier pattern covering a lower surface and a sidewall of the sixth conductive pattern. In example embodiments, an upper surface of the third contact plug 630 may be substantially coplanar with the upper surface of the second gate spacer 480.

The fourth insulating interlayer 530 may be formed on the second active pattern 405 and the second isolation pattern 430, and may cover the second source/drain layer 510. The fifth insulating interlayer 640 may be formed on the fourth insulating interlayer 530, the second gate structure 610, the second gate spacer 480, and the third contact plug 630.

Each of the fourth and fifth insulating interlayers 530 and 640 may include or may be formed of, for example, an insulating material such as silicon oxycarbide (SiOC), silicon oxide ($SiO_2$), silicon nitride (SiN), silicon oxynitride (SiON), silicon carbonitride (SiCN), silicon oxycarbonitride (SiOCN), or the like.

The fourth contact plug 650 and the second via 655 may correspond to the second contact plug 310 and the first via 315, respectively. Each of the fourth contact plug 650 and the second via 655 may extend through the fifth insulating interlayer 640. The fourth contact plug 650 may contact the upper surface of the fifth conductive pattern 600 included in the second gate structure 610, and the second via 655 may contact the upper surface of the third contact plug 630.

In example embodiments, a lower surface of the fourth contact plug 650 may be substantially coplanar with a lower surface of the second via 655.

Third and fourth wirings contacting and applying electrical signals to the fourth contact plug 650 and the second via 655, respectively, may be formed in various layouts.

Like the semiconductor device shown in FIGS. 1 to 4, a width in the first direction D1 of the second gate spacer 480 between the second gate structure 610 and the third contact plug 630 may be constant in the third direction D3. If the second gate spacer 480 has a partially thin width, the second gate structure 610 and the third contact plug 630 including conductive materials may be electrically shorted. However, in example embodiments, the electrical short between the second gate structure 610 and the third contact plug 630 may be reduced or prevented due to the constant width of the second gate spacer 480.

Additionally, an electrical short between the fourth contact plug 650 and the third contact plug 630 or an electrical short between the second via 655 and the second gate structure 610, which may occur if the fourth contact plug 650 or the second via 655 has a large width, may be prevented or reduced.

Figure 28:
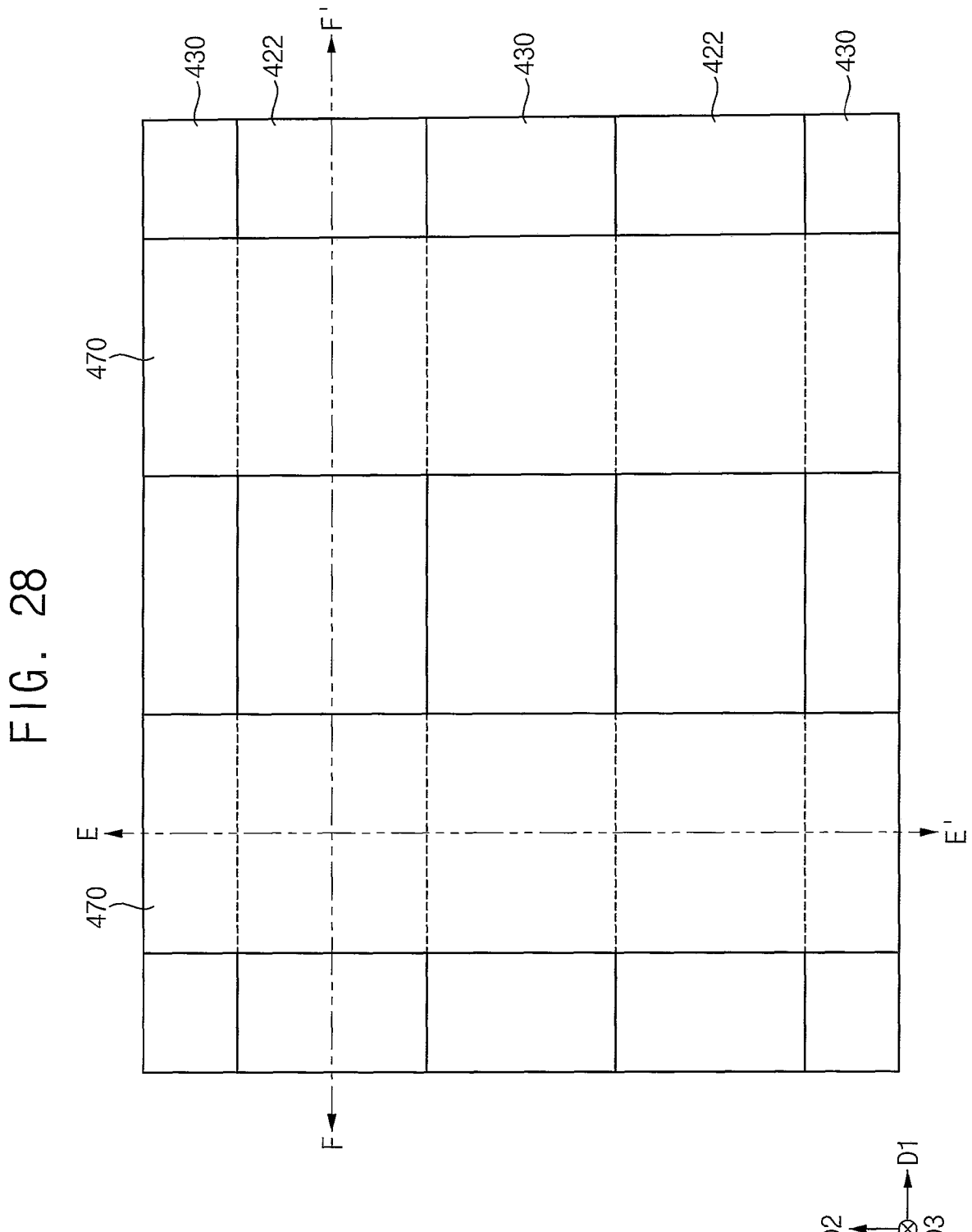
Figure 29:
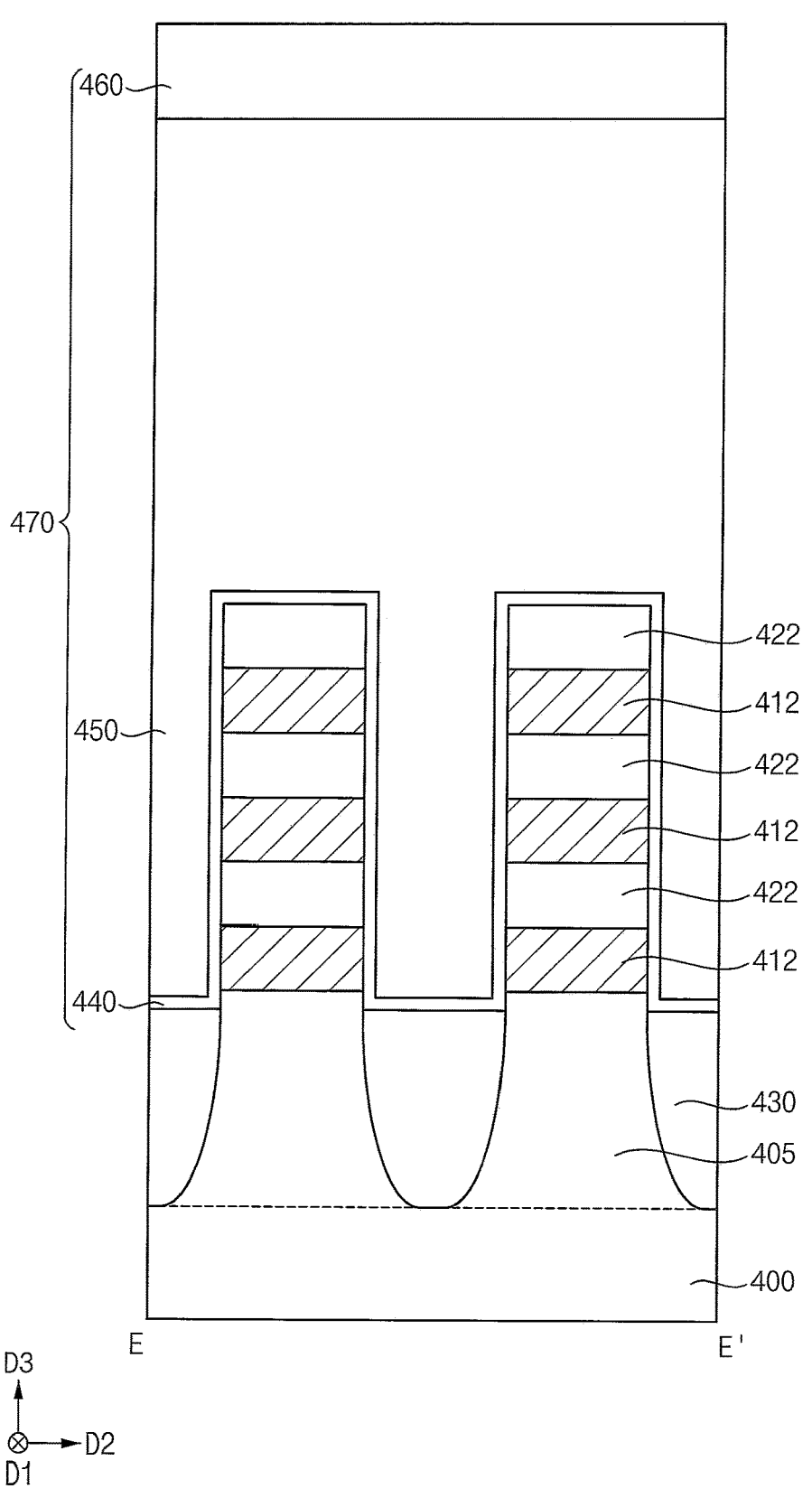
Figure 30:
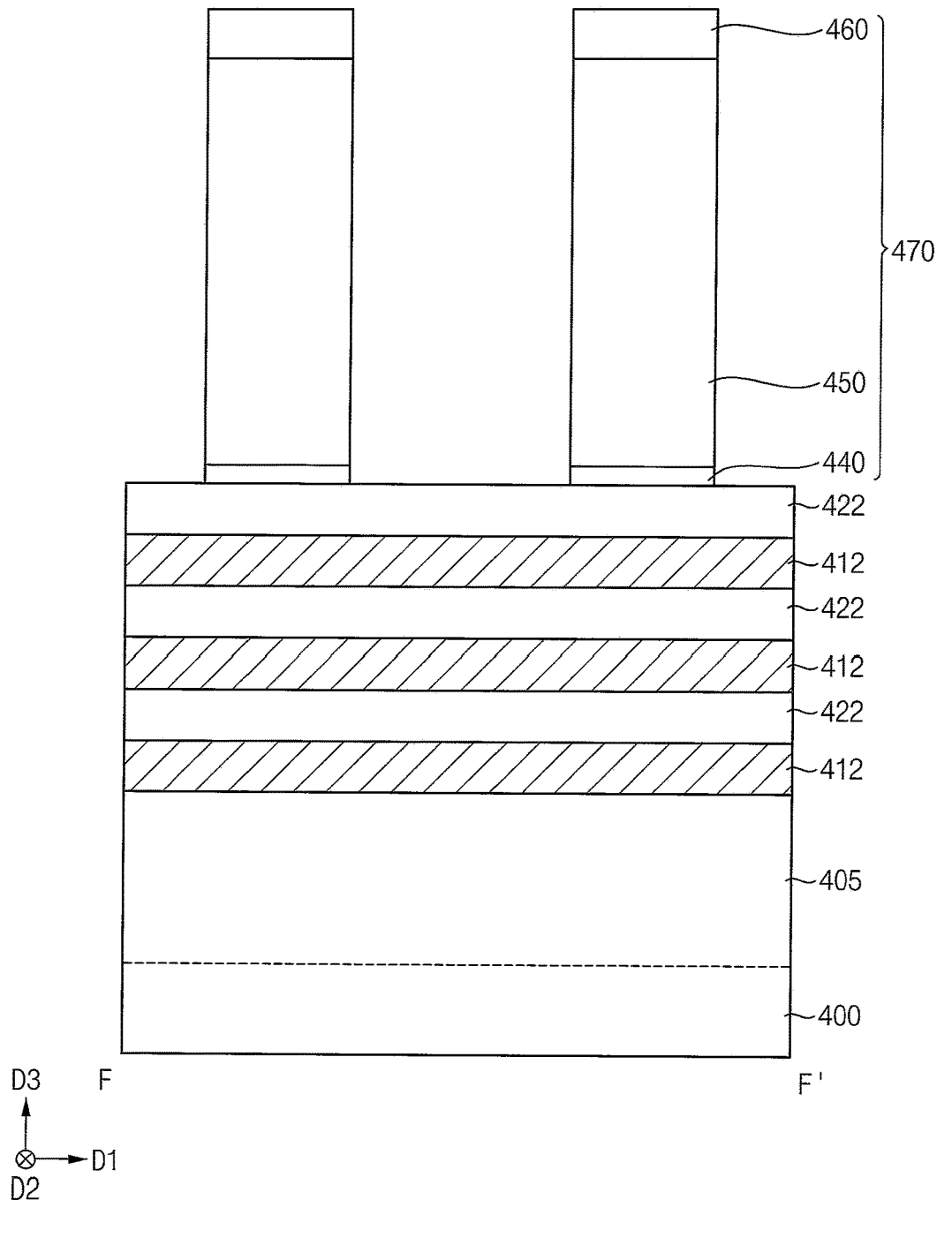
Figure 31:
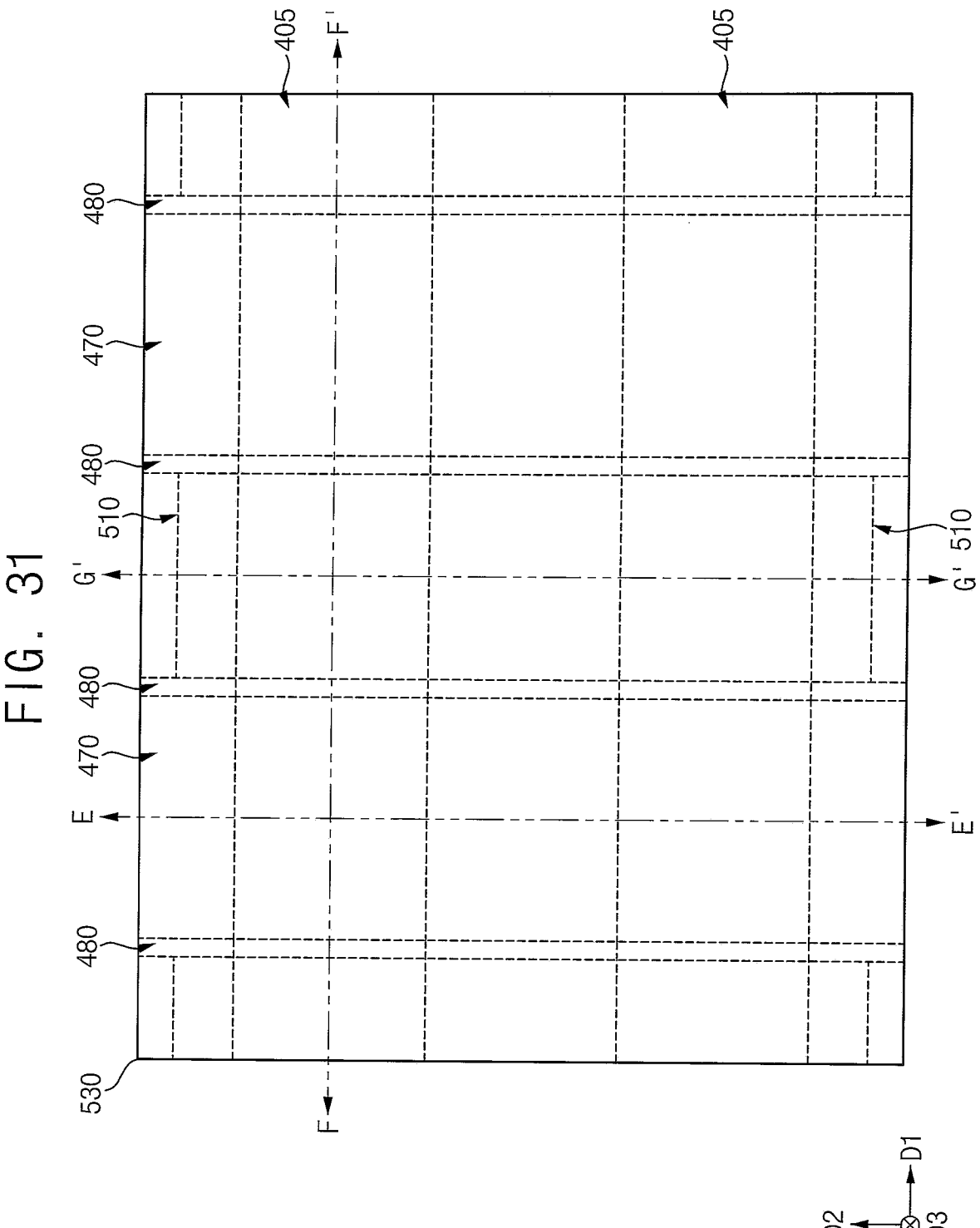

FIGS. 26 to 42 are plan views and cross-sectional view illustrating a method of manufacturing a semiconductor device in accordance with example embodiments. Specifically, FIGS. 26, 28 and 31 are plan views of a semiconductor device, and FIGS. 27, 29-30 and 41-42 are cross-sectional views of the semiconductor device.

More specifically, FIGS. 27, 29, 35 and 37 are cross-sectional views taken along lines E-E' of corresponding plan views, respectively. FIGS. 30, 32, 34, 36, 38, 39 and 42 are cross-sectional views taken along lines F-F' of corresponding plan views, respectively. FIG. 33 is a cross-sectional view taken along line C-C' of a corresponding plan view.

This method of manufacturing the semiconductor device may include processes substantially the same as or similar to the processes illustrated with reference to FIGS. 5 to 21 and FIGS. 1 to 4, and repeated explanations of the same or similar processes are omitted herein.

Figure 26:
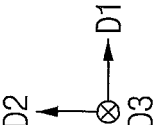

Referring to FIGS. 26 and 27, a second sacrificial layer and a semiconductor layer may be alternately and repeatedly stacked on the substrate 400. A first etch mask extending in the first direction D1 may be formed on an uppermost one of the semiconductor layers. The semiconductor layers, the second sacrificial layers and an upper portion of the substrate 400 may be etched using the first etch mask.

Thus, the second active pattern 405 extending in the first direction D1 may be formed on the substrate 400, and a fin structure including second sacrificial lines 412 and semiconductor lines 422 alternately and repeatedly stacked on the second active pattern 405 may be formed. In example embodiments, a plurality of fin structures may be formed to be spaced apart from each other in the second direction D2 on the substrate 400.

FIG. 27 shows that the second sacrificial lines 412 are formed in three levels, and the semiconductor lines 422 are formed in three levels on the substrate 400, however, the inventive concept is not limited thereto. Each of the second sacrificial lines 412 may include or may be formed of a material having etch selectivity with respect to the substrate 400 and the semiconductor lines 422.

The second isolation pattern 430 may be formed on the substrate 400 to cover a sidewall of the second active pattern 405.

Referring to 28 to 30, a second dummy gate structure 470 may be formed on the substrate 400 to partially cover the fin structure and the second isolation pattern 430.

Specifically, a second dummy gate insulating layer, a second dummy gate electrode layer and a second dummy gate mask layer may be sequentially formed on the substrate 400 on which the fin structure and the second isolation pattern 430 are formed, a second etch mask extending in the second direction D2 may be formed on the second dummy gate mask layer, and the second dummy gate mask layer may be etched using the second etch mask to form a second dummy gate mask 460 on the substrate 400.

The second dummy gate electrode layer and the second dummy gate insulating layer thereunder may be etched using the second dummy gate mask 460 as an etch mask to form a second dummy gate electrode 450 and a second dummy gate insulating pattern 440, respectively, on the substrate 400.

The second dummy gate insulating pattern 440, the second dummy gate electrode 450 and the second dummy gate mask 460 sequentially stacked on the second active pattern 405 and a portion of the second isolation pattern 430 adjacent to the second active pattern 405 may form a second dummy gate structure 470. In example embodiments, the second dummy gate structure 470 may extend in the second direction D2 on the fin structure and the second isolation pattern 430, and the second dummy gate structure 470 may cover an upper surface and opposite sidewalls in the direction D2 of the fin structure.

Figure 32:
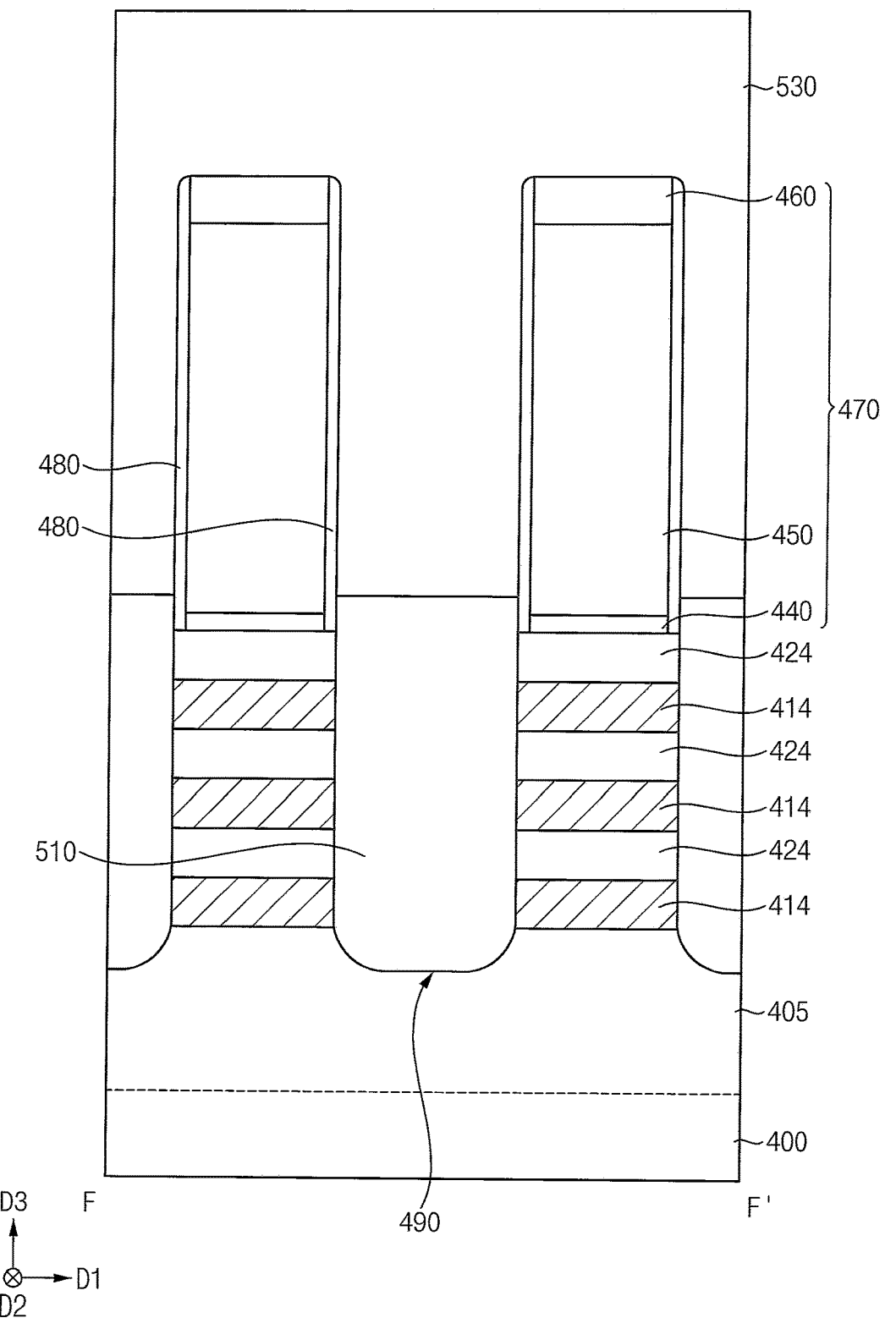
Figure 33:
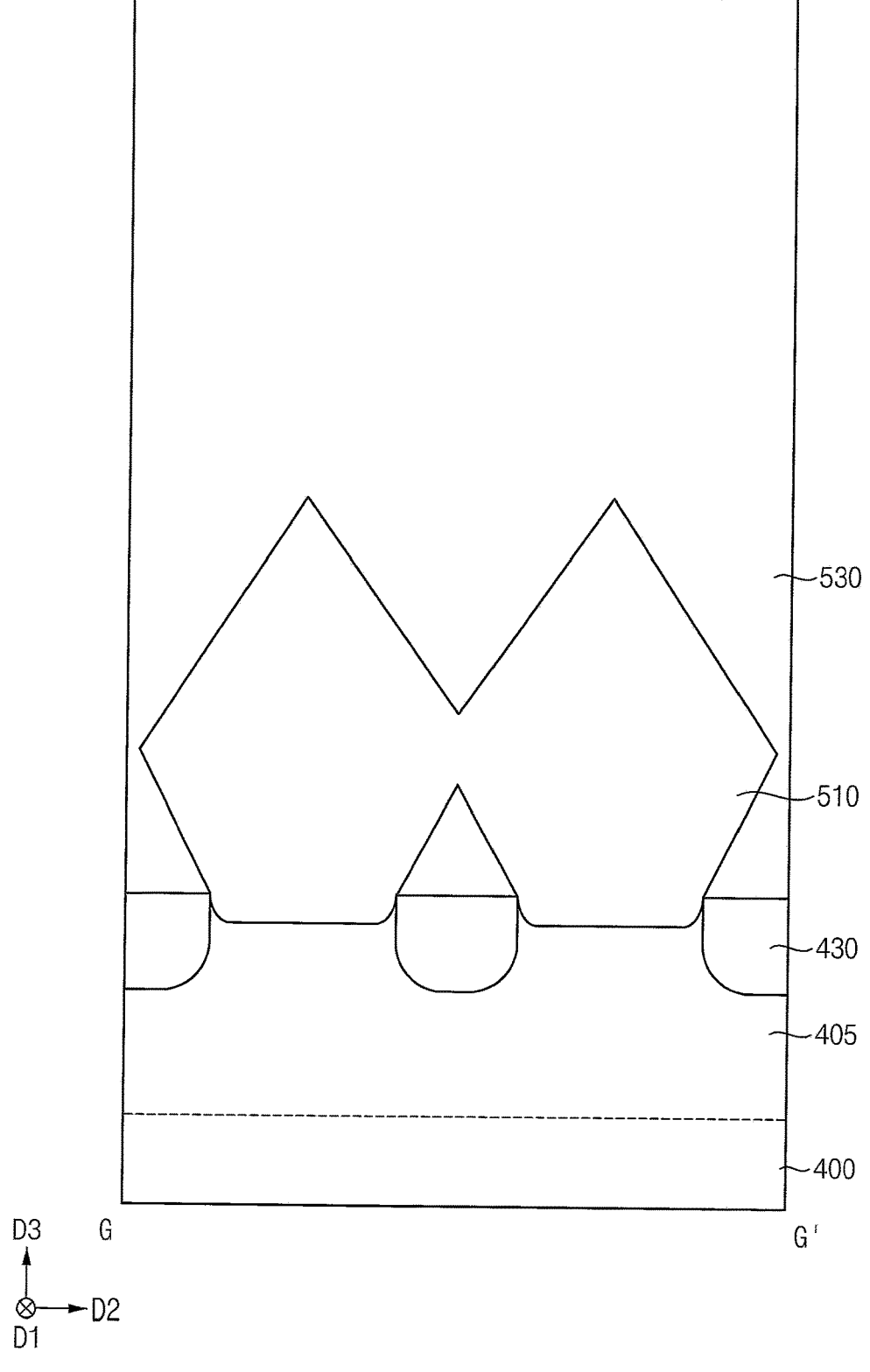

Referring to FIGS. 31 to 33, the second gate spacer 480 may be formed on a sidewall of the second dummy gate structure 470.

Specifically, a second spacer layer may be formed on the substrate 400 on which the fin structure, the second isolation pattern 430 and the second dummy gate structure 470 are formed, and the second spacer layer may be anisotropically etched to form the second gate spacer 480 covering each of opposite sidewalls in the first direction D1 of the second dummy gate structure 470.

The exposed fin structure and the second active pattern 405 thereunder may be etched using the second dummy gate structure 470 and the second gate spacer 480 as an etch mask to form a third opening 490.

Accordingly, the second sacrificial lines 412 and the semiconductor lines 422 under the second dummy gate structure 470 and the second gate spacer 480 may be transformed into second sacrificial patterns 414 and the semiconductor pattern 424, respectively, and the fin structure extending in the first direction D1 may be divided into a plurality of parts spaced apart from each other in the first direction D1.

Hereinafter, for the convenience of explanation, the second dummy gate structure 470, the second gate spacers 480 on respective opposite sidewalls of the second dummy gate structure 470, and the fin structure under the second dummy gate structure 470 and the second gate spacer 480 may be referred to as a stack structure. In example embodiments, the stack structure may extend in the second direction D2, and a plurality of stack structures may be spaced apart from each other in the first direction D1.

In an example embodiment, a portion of each of the second sacrificial patterns 414 adjacent to the third opening 490 may be removed to form a gap, and an inner spacer (not shown) may be formed in the gap.

A selective epitaxial growth (SEG) process may be performed using sidewalls of the semiconductor patterns 424 and the second sacrificial patterns 414 and the upper surface of the second active pattern 405 exposed by the third opening 490 as a seed layer to form the second source/drain layer 510 in the third opening 490.

In an example embodiment, the second source/drain layer 510 may include or may be formed of a single crystal silicon-germanium (SiGe) layer doped with p-type impurities. In an embodiment, the second source/drain layer 510 may include or may be formed of a single crystal silicon layer doped with n-type impurities or a single crystal silicon carbide layer doped with n-type impurities.

The fourth insulating interlayer 530 may be formed on the substrate 400 to cover the stack structure and the second source/drain layer 510.

Figure 34:
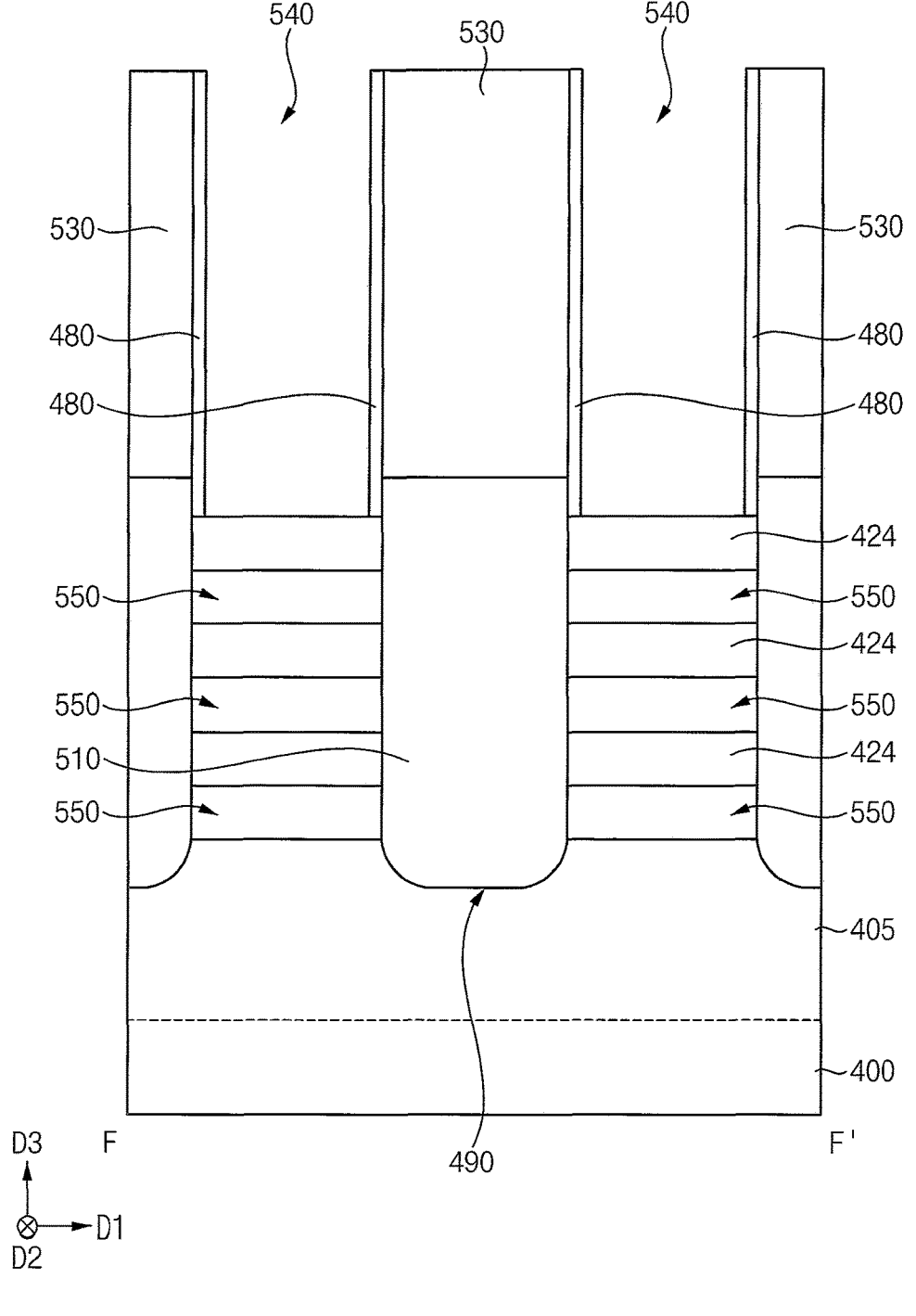

Referring to FIG. 34, processes similar to the processes illustrated with reference to FIG. 11 may be performed.

Accordingly, a planarization process may be performed to expose an upper surface of the second dummy gate electrode 450 included in the stack structure, and an upper portion of the fourth insulating interlayer 530 and the second dummy gate mask 460 included in the second dummy gate structure 470 may be removed.

The exposed second dummy gate electrode 450, the second dummy gate insulating pattern 440 and the second sacrificial patterns 414 may be removed by, for example, a wet etching process and/or a dry etching process to form a fourth opening 540 exposing the inner sidewall of the second gate spacer 480 and an upper surface of the uppermost one of the semiconductor patterns 424, and a fifth opening 550 exposing a portion of the sidewall of the second source/drain layer 510, surfaces of the semiconductor patterns 424 and the upper surface of the second active pattern 405.

Figure 35:
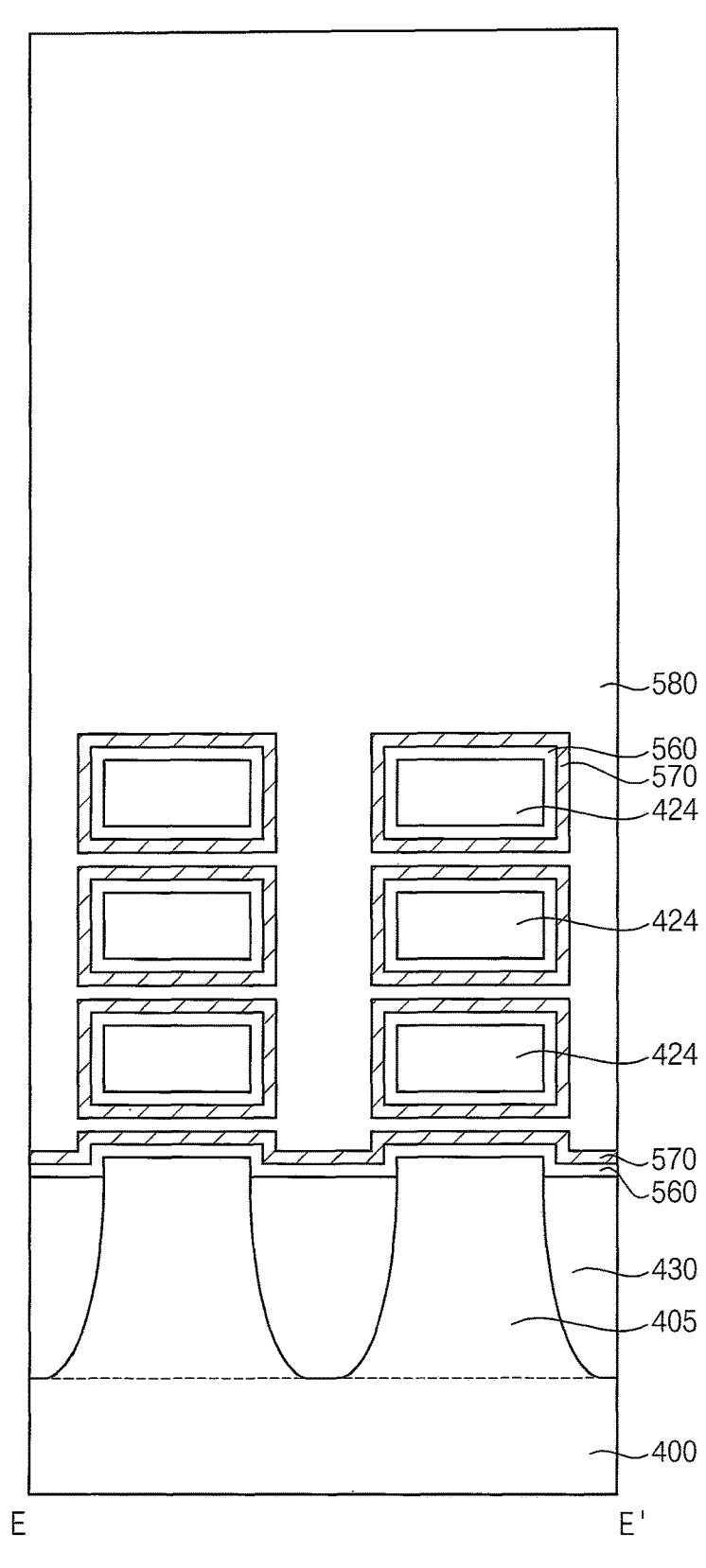
Figure 36:
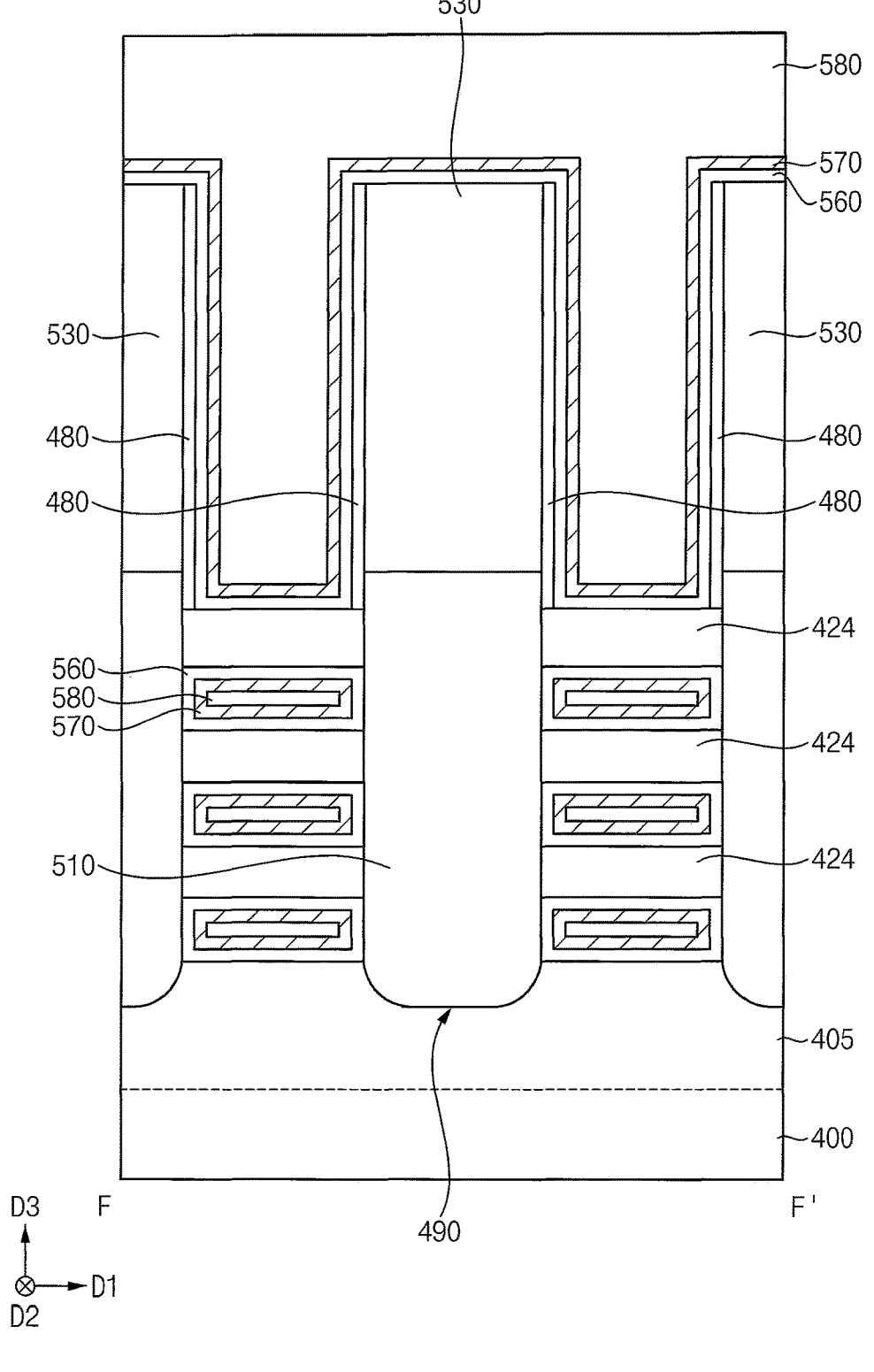

Referring to FIGS. 35 and 36, processes similar to the processes illustrated with reference to FIGS. 12 and 13 may be performed.

Accordingly, a second gate insulating layer 560 and a third conductive layer 570 may be sequentially formed on the upper surface of the second active pattern 405, the upper surface of the second isolation pattern 430, the portion of the sidewall of second source/drain layer 510, the surfaces of the semiconductor patterns 424 and the inner sidewall of the second gate spacer 480 exposed by the fourth and fifth openings 540 and 550, and an upper surface of the fourth insulating interlayer 530. A third sacrificial layer 580 may be formed on the third conductive layer 570 to fill remaining portions of the fourth and fifth openings 540 and 550.

In an example embodiment, an interface pattern including or being formed of, for example, silicon oxide, may be further formed on the upper surface of the second active pattern 405 and the surfaces of the semiconductor patterns 424.

Figure 37:
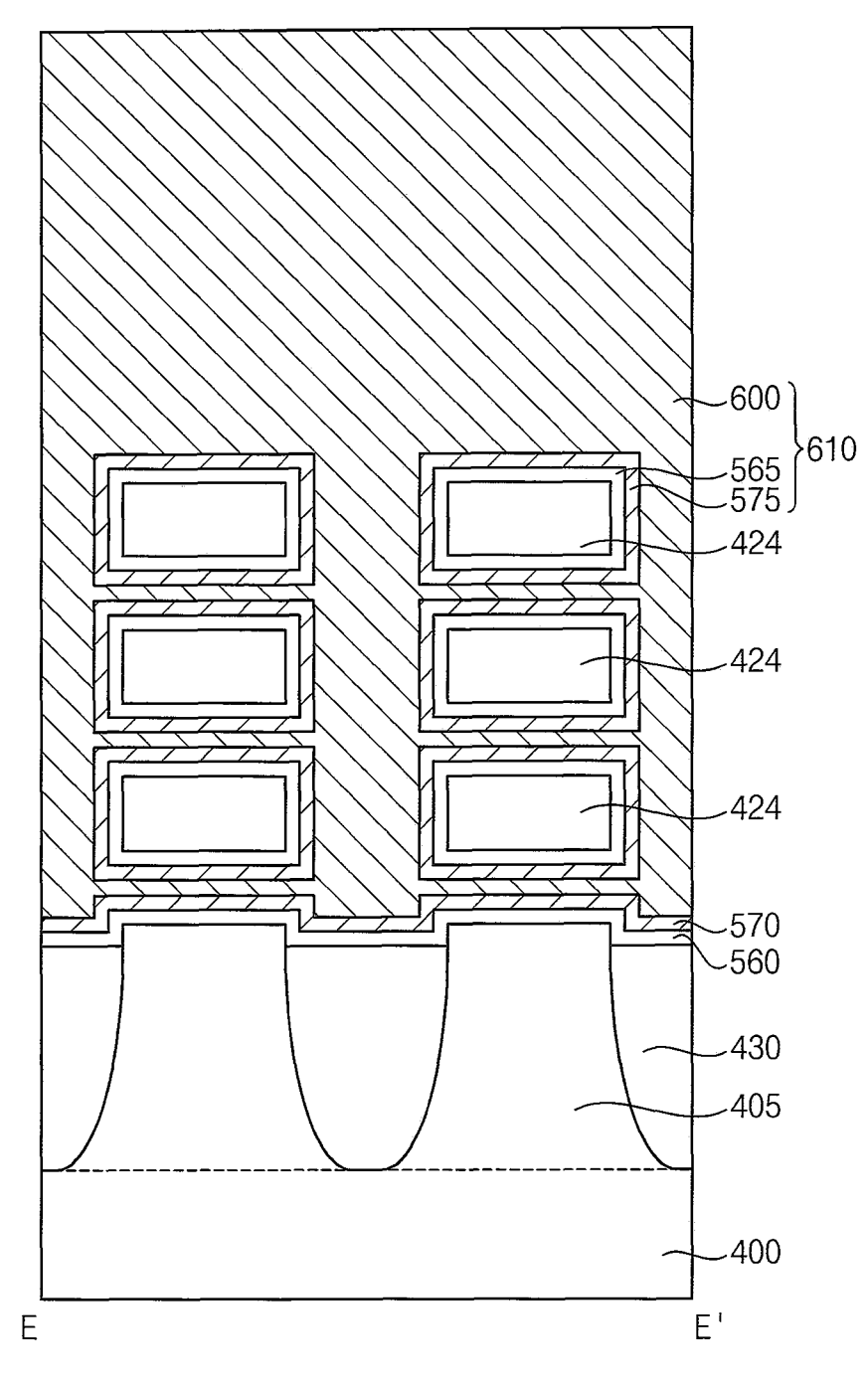
Figure 38:
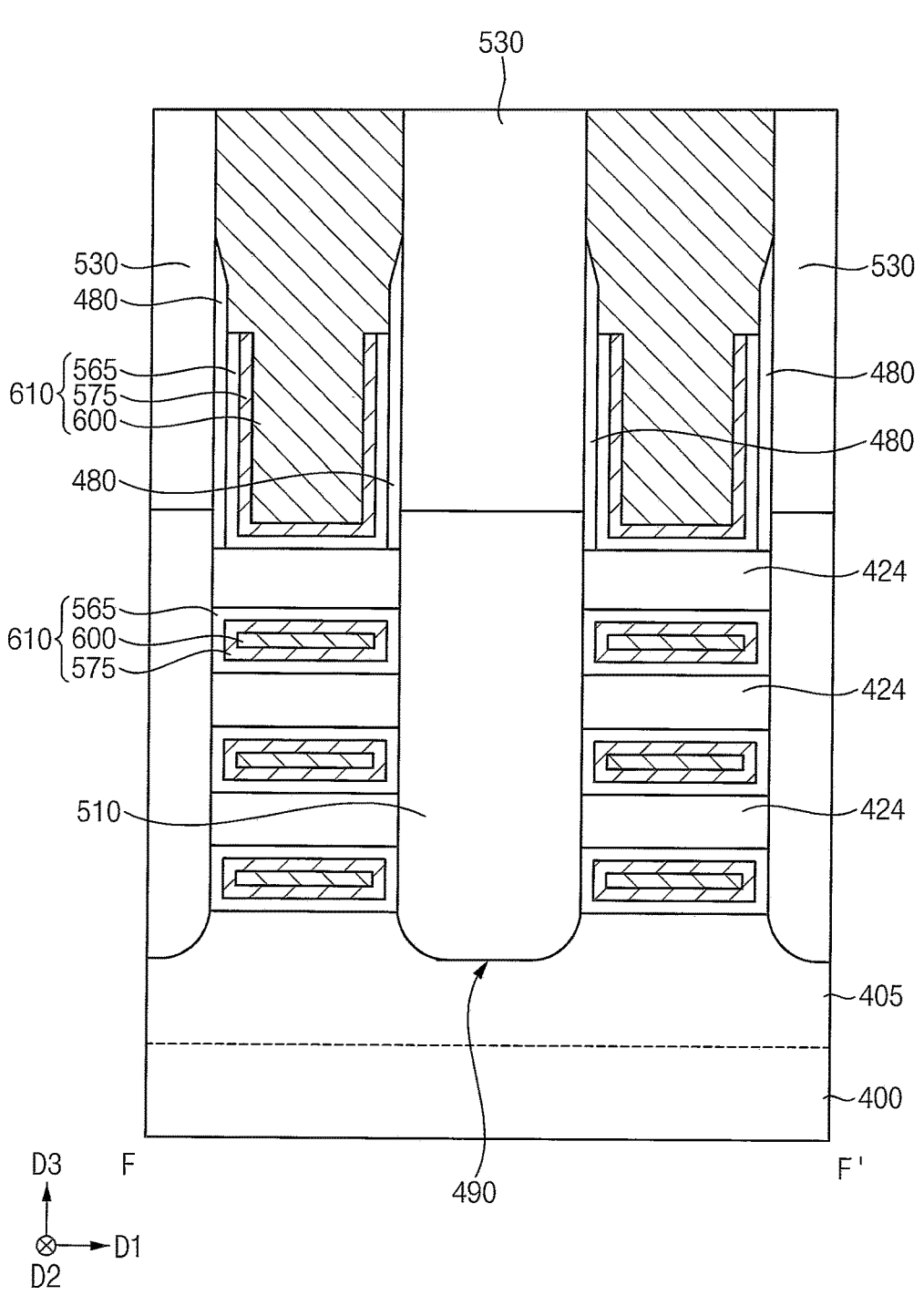

Referring to FIGS. 37 and 38, processes substantially the same as or similar to the processes illustrated with reference to FIGS. 14 to 17 may be performed.

Accordingly, a portion of the second gate structure 610 including the second gate insulating pattern 565, the fourth conductive pattern 575 and the fifth conductive pattern 600, and the second gate spacer 480 covering a lower sidewall of the portion of second gate structure 610 may be formed in the fourth opening 540. A remaining portion of the second gate structure 610 including the second gate insulating pattern 565, the fourth conductive pattern 575, and the fifth conductive pattern 600 may be formed in the fifth opening 550.

An upper portion of the portion of the fifth conductive pattern 600 in the fourth opening 540 may have a larger width than a lower portion of the portion of the fifth conductive pattern 600 in the fourth opening 540. A sidewall of the upper portion of the portion of the fifth conductive pattern 600 may not be covered by the second gate spacer 480, but may contact a sidewall of the fourth insulating interlayer 530.

Figure 39:
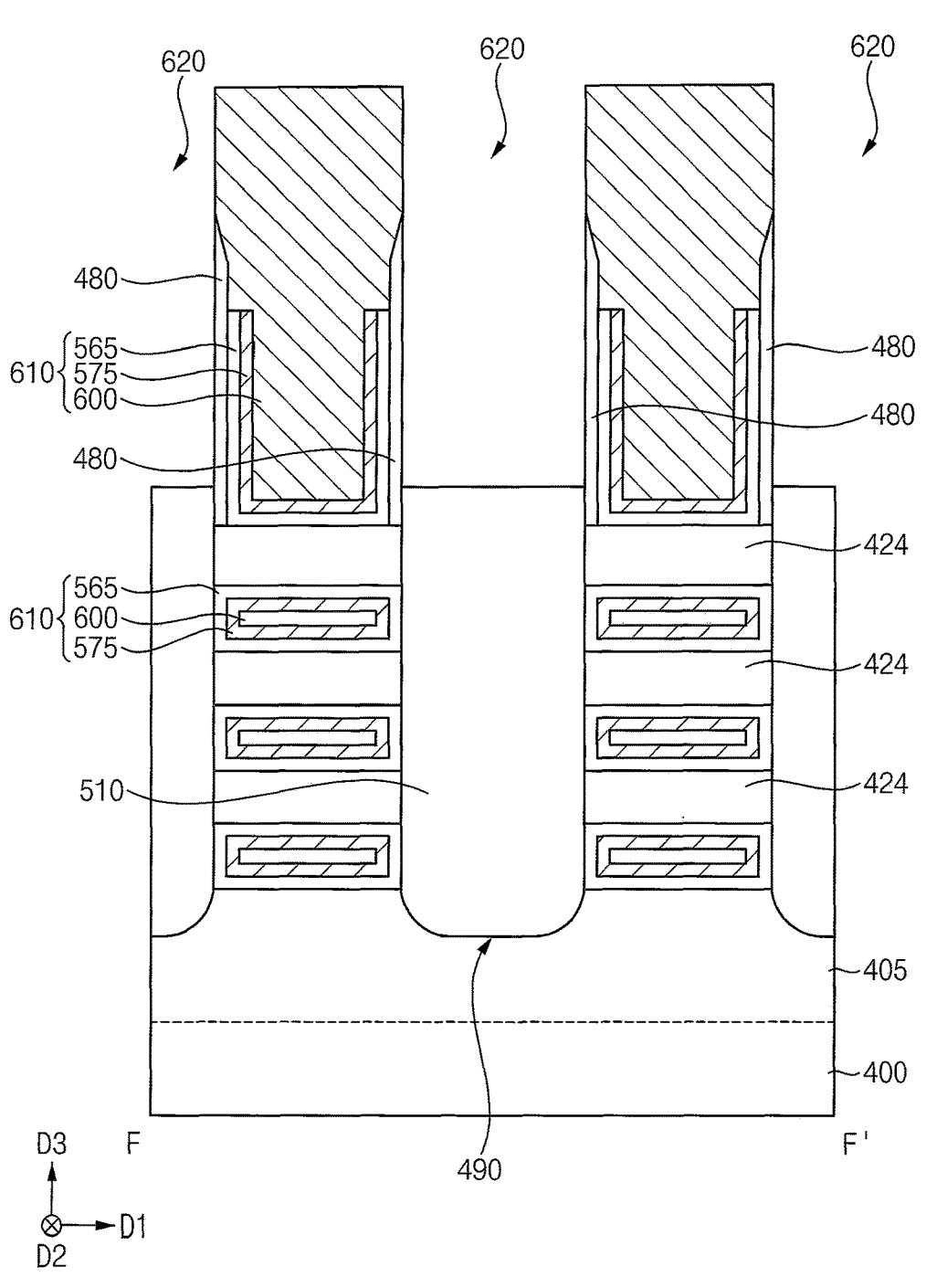

Referring to FIG. 39, processes substantially the same as or similar to the processes illustrated with reference to FIG. 18 may be performed.

Accordingly, a portion of the fourth insulating interlayer 530 between the second gate structure 610 and the second gate spacer 480 may be removed to form a sixth opening 620 exposing the upper surface of the second source/drain layer 510.

In example embodiments, the portion of the fourth insulating interlayer 530 may be removed by a dry etching process using the fifth conductive pattern 600 including metal as an etch mask. In the dry etching process, the fifth conductive pattern 600 including metal and the fourth insulating interlayer including, for example, an oxide may have a high etch selectivity, and thus, during a time when the fourth insulating interlayer 530 is removed in the dry etching process, the fifth conductive pattern 600 may hardly be removed.

Accordingly, the sixth opening 620 that may be self-aligned to the second gate spacer 480 may have a sidewall substantially perpendicular to the upper surface of the substrate 400.

Figure 40:
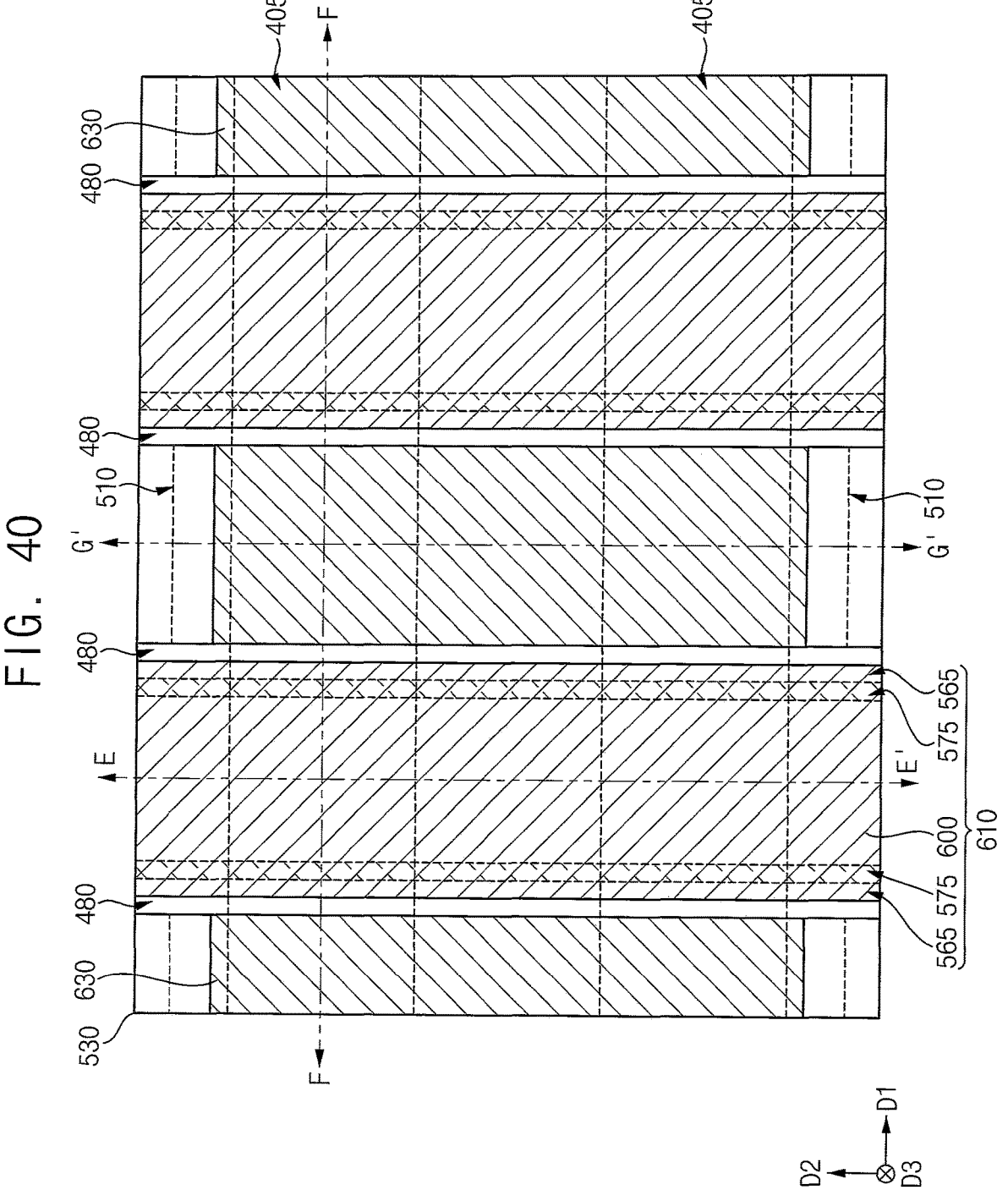
Figure 41:
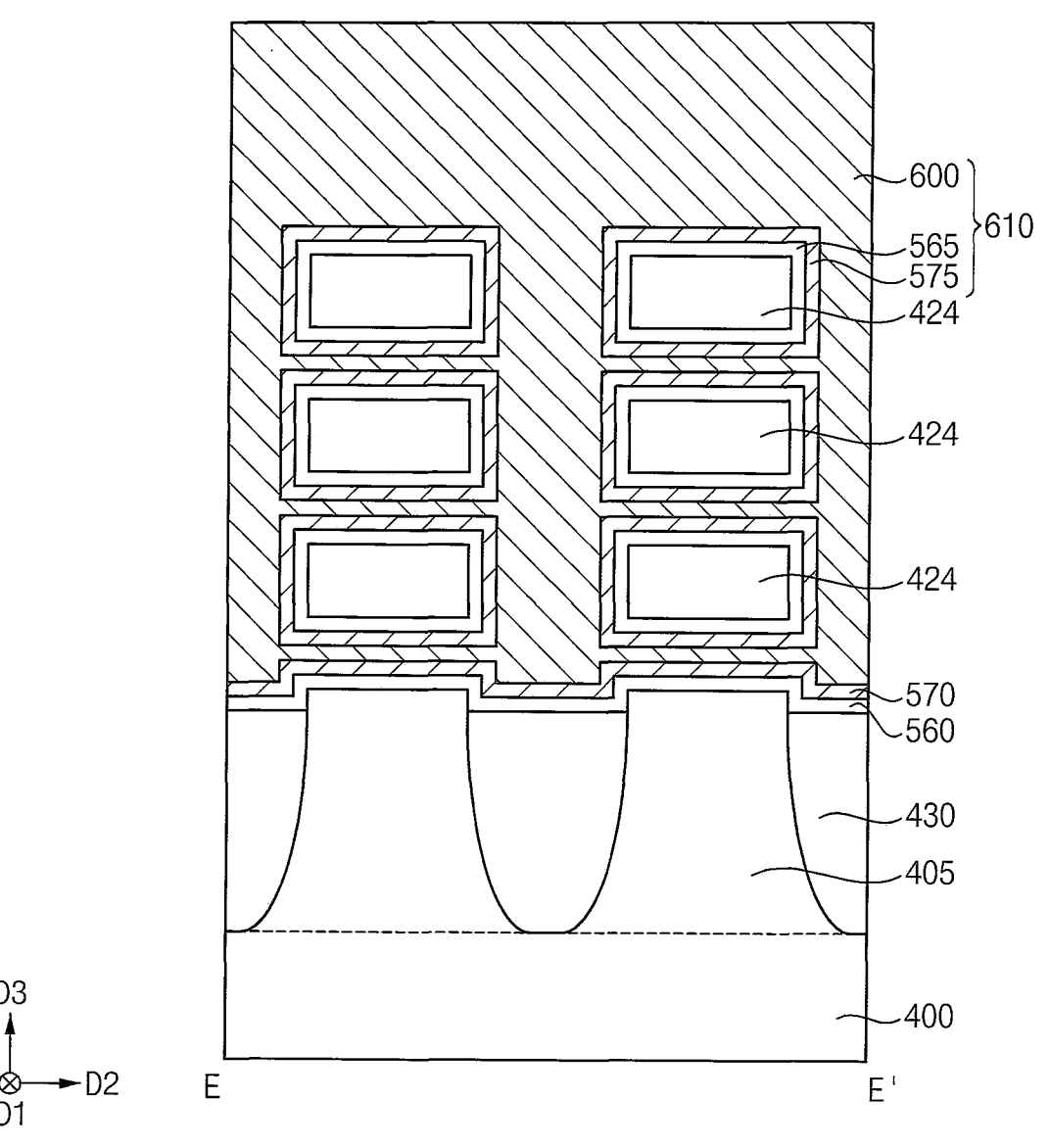
Figure 42:
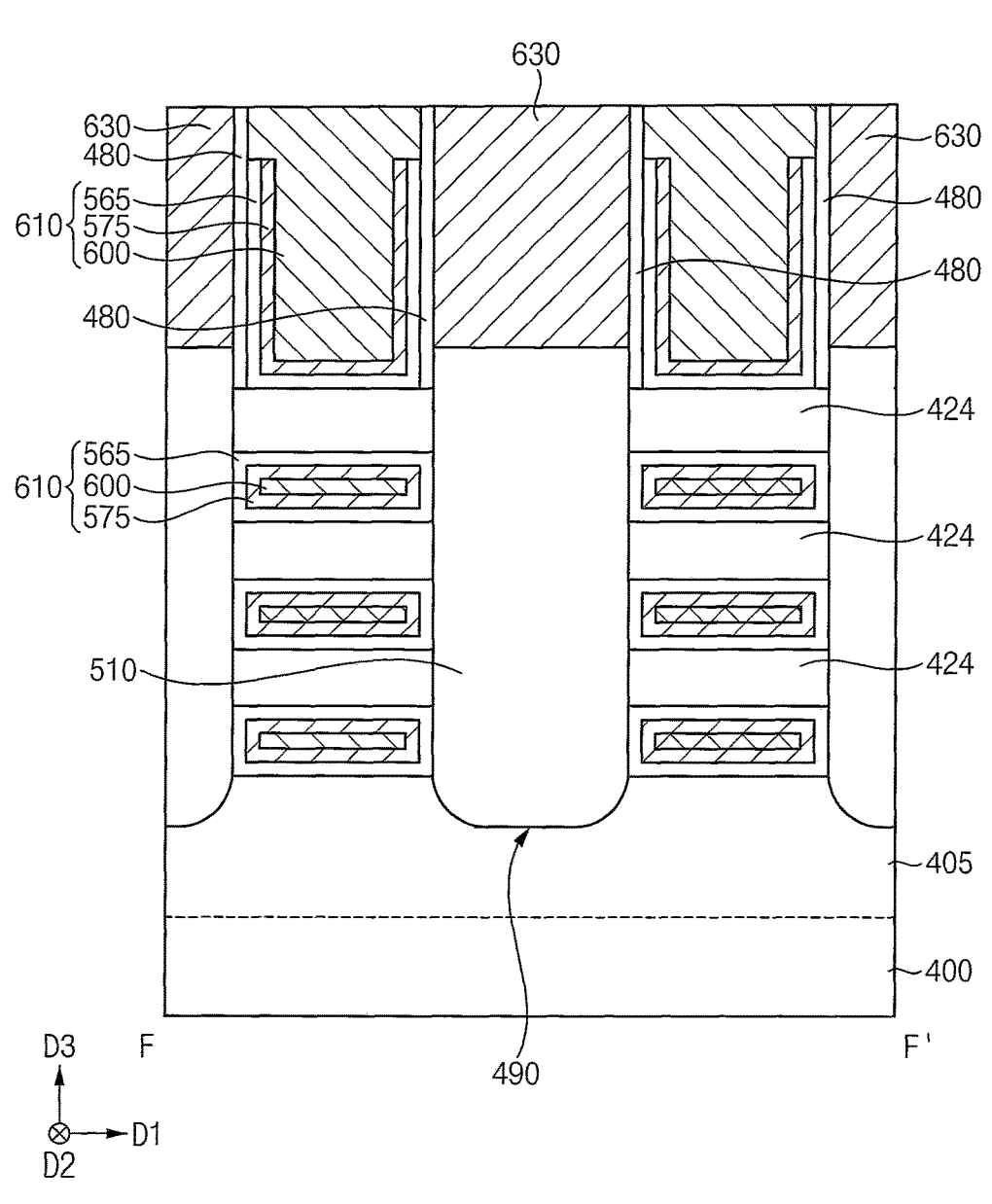

Referring to FIGS. 40 to 42, processes substantially the same as or similar to those illustrated with reference to FIGS. 19 to 21 may be performed.

Accordingly, the third contact plug 630 may be formed in the sixth opening 620. During a time when the planarization process is performed, the upper portion of the fifth conductive pattern 600 including the inclined sidewall may be removed. Thus, the second gate spacer 480 between the third contact plug 630 and the second gate structure 610 may have substantially the same thickness in the third direction D3.

In an example embodiment, the third contact plug 630 may include the sixth conductive pattern and the second barrier pattern covering the bottom and the sidewall of the sixth conductive pattern, and the second barrier pattern may include or may be formed of, for example, a metal nitride.

Referring to FIGS. 22 to 25, processes substantially the same as or similar to those illustrated with reference to FIGS. 1 to 4 may be performed.

Accordingly, the fifth insulating interlayer 640 may be formed on the second gate structure 610, the second gate spacer 480, the third contact plug 630 and the fourth insulating interlayer 530, and the fourth contact plug 650 and the second via 655 may be formed through the fifth insulating interlayer 640 to contact the upper surfaces of the second gate structure 610 and the third contact plug 630, respectively.

Upper wirings may be further formed to complete the manufacturing of the semiconductor device.

The above-described semiconductor device may be used in various memory devices and systems including contact plugs. For example, the semiconductor device may be applied to a logic device, which may include a contact plug, such as a central processing unit (CPU, MPU), an application processor (AP), or the like. In an embodiment, the semiconductor device may be applied to a volatile memory device, which may include a contact plug, such as a DRAM device, a SRAM device, etc., or a non-volatile memory device, which may include a contact plug, such as a flash memory device, a PRAM device, a MRAM device, an RRAM device, etc.

While example embodiments have been particularly shown and described, it will be understood by one of ordinary skill in the art that variations in form and detail may be made therein without departing from the spirit and scope of the claims.

What is claimed is:

1. A semiconductor device, comprising:
a gate structure on a substrate;
a gate spacer on a sidewall of the gate structure;
a source/drain layer on a portion of the substrate adjacent to the gate structure;
a first contact plug on the source/drain layer and contacting an outer sidewall of the gate spacer,
wherein the gate structure includes:
a first conductive pattern having:
a lower portion; and
an upper portion on the lower portion with a width greater than a width of the lower portion and in contact with an inner sidewall of the gate spacer;
a second conductive pattern on a lower surface and a sidewall of the lower portion of the first conductive pattern; and
a gate insulating pattern on a lower surface and an outer sidewall of the second conductive pattern, and
wherein an upper surface of the first conductive pattern is substantially coplanar with an upper surface of the first contact plug; and
a second contact plug contacting the upper surface of the first conductive pattern,
wherein a lower surface of the second contact plug has a first width, and
wherein the upper surface of the first conductive pattern has a second width greater than the first width.

2. The semiconductor device of claim 1,
wherein a width of the gate spacer in a horizontal direction substantially parallel to an upper surface of the substrate is substantially constant along a vertical direction substantially perpendicular to the upper surface of the substrate.

3. The semiconductor device of claim 1,
wherein an uppermost surface of the second conductive pattern is substantially coplanar with an uppermost surface of the gate insulating pattern.

4. The semiconductor device of claim 1,
wherein an outer sidewall of the gate insulating pattern contacts the inner sidewall of the gate spacer.

5. The semiconductor device of claim 1,
wherein an upper surface of the gate spacer is substantially coplanar with the upper surface of the first conductive pattern.

6. The semiconductor device of claim 1, further comprising:
a via contacting the upper surface of the first contact plug,
wherein the lower surface of the second contact plug is substantially coplanar with a lower surface of the via.

7. The semiconductor device of claim 1, further comprising:
    an active pattern extending in a first direction substantially parallel to the upper surface of the substrate and protruding from the upper surface of the substrate in a third direction substantially perpendicular to the upper surface of the substrate; and
    an isolation pattern covering a lower sidewall of the active pattern,
    wherein the gate structure is disposed on the active pattern and the isolation pattern, and extends in a second direction substantially parallel to the upper surface of the substrate and intersecting the first direction.

8. The semiconductor device of claim 7, further comprising:
    a plurality of channels spaced apart from each other in the third direction on the active pattern, each of the plurality of channels extending in the first direction,
    wherein the gate structure covers opposite sidewalls in the second direction and upper and lower surfaces of each channel of the plurality of channels.

9. A semiconductor device comprising:
    a plurality of channels spaced apart from each other on a substrate in a vertical direction substantially perpendicular to an upper surface of the substrate;
    a gate structure on the substrate and covering upper and lower surfaces and a sidewall of a portion of each channel of the plurality of channels;
    a gate spacer on a sidewall of a first portion of the gate structure, the first portion of the gate structure being disposed on an uppermost channel of the plurality of channels;
    a source/drain layer on a portion of the substrate adjacent to the gate structure and contacting sidewalls of the plurality of channels;
    a first contact plug on the source/drain layer and contacting an outer wall of the gate spacer,
    wherein the first portion of the gate structure includes:
    a first conductive pattern having:
        a lower portion on the uppermost channel of the plurality of channels; and
        an upper portion on the lower portion with a width greater than a width of the lower portion and contacting an inner sidewall of the gate spacer;
    a second conductive pattern on a lower surface and a sidewall of the lower portion of the first conductive pattern; and
    a gate insulating pattern on a lower surface and an outer sidewall of the second conductive pattern and contacting an upper surface of the uppermost channel of the plurality of channels and the inner sidewall of the gate spacer, and
    wherein an upper surface of the first conductive pattern is substantially coplanar with an upper surface of the first contact plug-; and
    a second contact plug contacting the upper surface of the first conductive pattern, wherein a lower surface of the second contact plug has a first width, and wherein the upper surface of the first conductive pattern has a second width greater than the first width.

10. The semiconductor device of claim 9,
    wherein the gate insulating pattern, the second conductive pattern, and the first conductive pattern are sequentially stacked on a surface of each channel of the plurality of channels.

11. The semiconductor device of claim 9,
    wherein an uppermost surface of the second conductive pattern is substantially coplanar with an uppermost surface of the gate insulating pattern.

12. The semiconductor device of claim 9,
    wherein an upper surface of the gate spacer is substantially coplanar with the upper surface of the first conductive pattern.

13. The semiconductor device of claim 9, further comprising:
    a via contacting the upper surface of the first contact plug,
    wherein the lower surface of the second contact plug is substantially coplanar with a lower surface of the via.

14. A semiconductor device comprising:
    an active pattern on a substrate;
    a gate structure on the active pattern,
    wherein the gate structure includes:
    a first conductive pattern having:
        a lower portion; and
        an upper portion on the lower portion with a width greater than that of the lower portion;
    a second conductive pattern on a lower surface and a sidewall of the lower portion of the first conductive pattern; and
    a gate insulating pattern on a lower surface and an outer sidewall of the second conductive pattern;
    a gate spacer on a sidewall of the gate structure;
    a source/drain layer on a portion of the active pattern adjacent to the gate structure;
    a first contact plug on the source/drain layer and contacting an outer sidewall of the gate spacer;
    a second contact plug contacting an upper surface of the first conductive pattern, wherein a lower surface of the second contact plug has a first width, and wherein the upper surface of the first conductive pattern has a second width greater than the first width; and
    a via contacting an upper surface of the first contact plug,
    wherein the upper portion of the gate structure contacts an inner sidewall of the gate spacer, and
    wherein the upper surface of the first conductive pattern is substantially coplanar with the upper surface of the first contact plug.

15. The semiconductor device of claim 14,
    wherein the lower surface of the second contact plug is substantially coplanar with a lower surface of the via.

16. The semiconductor device of claim 14,
    wherein an uppermost surface of the second conductive pattern is substantially coplanar with an uppermost surface of the gate insulating pattern.

17. The semiconductor device of claim 14,
    wherein an outer sidewall of the gate insulating pattern contacts the inner sidewall of the gate spacer.

18. The semiconductor device of claim 14,
    wherein an upper surface of the gate spacer is substantially coplanar with the upper surface of the first conductive pattern.

19. The semiconductor device of claim 14, further comprising;
    a plurality of channels spaced apart from each other on the active pattern in a vertical direction substantially perpendicular to the upper surface of the substrate,
    wherein the gate structure covers upper and lower surfaces and a sidewall of a portion of each channel of the plurality of channels.

*    *    *    *    *